(12) United States Patent
Okada et al.

(10) Patent No.: US 6,567,590 B1
(45) Date of Patent: May 20, 2003

(54) OPTICAL COMMUNICATION DEVICE

(75) Inventors: Takeshi Okada, Osaka (JP); Hiromi Nakanishi, Osaka (JP); Yoshiki Kuhara, Osaka (JP); Naoyuki Yamabayashi, Osaka (JP)

(73) Assignees: Sumitomo Electric Industries, Ltd., Osaka (JP); NHK Spring Co., Ltd., Yokohama (JP)

( * ) Notice: Subject to any disclaimer, the term of this patent is extended or adjusted under 35 U.S.C. 154(b) by 189 days.

(21) Appl. No.: 09/761,697

(22) Filed: Jan. 18, 2001

(30) Foreign Application Priority Data

Jan. 21, 2000 (JP) ........................................ 2000-012857

(51) Int. Cl.⁷ ................................................ G02B 6/30
(52) U.S. Cl. ............................ 385/49; 385/14; 385/88; 385/92
(58) Field of Search ............................ 385/49, 14, 88, 385/89, 92, 93, 94

(56) References Cited

U.S. PATENT DOCUMENTS

| | | | |
|---|---|---|---|
| 4,293,826 A | 10/1981 | Scifres et al. | 385/88 X |
| 5,258,991 A | * 11/1993 | Peterson | 257/80 |
| 5,400,419 A | * 3/1995 | Heinen | 359/114 |
| 5,577,142 A | 11/1996 | Mueller-Fiedler et al. | 385/47 |
| 5,881,193 A | 3/1999 | Anigbo et al. | 385/93 X |
| 5,883,988 A | * 3/1999 | Yamamoto et al. | 250/227.15 |
| 6,097,521 A | * 8/2000 | Althaus et al. | 359/143 |

FOREIGN PATENT DOCUMENTS

| | | | |
|---|---|---|---|
| DE | 43 13 492 C1 | 7/1994 | 385/88 X |
| EP | 0 473 339 A1 | 3/1992 | 385/88 X |
| EP | 0790 678 A2 | 8/1997 | 385/88 X |

OTHER PUBLICATIONS

Copy of European Search Report for counterpart application No. EP 01 10 1093, dated Apr. 17, 2001.

T. Yamamoto et al. "Highly Uniform Optical Power Monitor Characteristics Using Surface Mounting Telchology onto PLC Platform" Proceedings of the 1997 Electronics Society Conference of IEICE, Sep. 3–6, 1997, pp. 1–8.

G. Nakagawa et al. "High Power and High Sensitivity PLC Module Using A Novel Corner–Illuminated PIN Photodiode" 1997 Electronic Components and Technology Conference, 1997 pp. 607–613.

M. Shishikura et al. "A Symmetric Double–Core InGaAlAs Waveguide Photodiode For Hybrid Integration on Optical Platforms" IEEE LSERS and Electro–Optics Society(9th Meeting) Nov. 18–19, 1996 pp. 12–13.

* cited by examiner

*Primary Examiner*—Brian Healy
(74) *Attorney, Agent, or Firm*—Smith, Gambrell & Russell, LLP

(57) ABSTRACT

An optical communication device (an LD module or an LD/PD module) having a flat substrate, a light waveguide layer formed upon the substrate with a core for guiding signal LD light, an LD bonded upon a part of the substrate without the whole or a part of the light waveguide layer for producing signal front light and monitoring rear light, a path conversion groove being perforated along the core on the substrate behind the LD and having slanting walls for reflecting rear light emitted backward from the LD, a bottom- or top-incidence type PD bonded upon the light waveguide layer over the path conversion groove for monitoring the LD power by detecting the LD rear light reflected by the path conversion groove. Since the PD level is higher than the LD by the thickness of the light waveguide layer, the monitoring PD can sense more than 50% of the LD rear light.

16 Claims, 14 Drawing Sheets

EMBODIMENT 1

Fig. 8
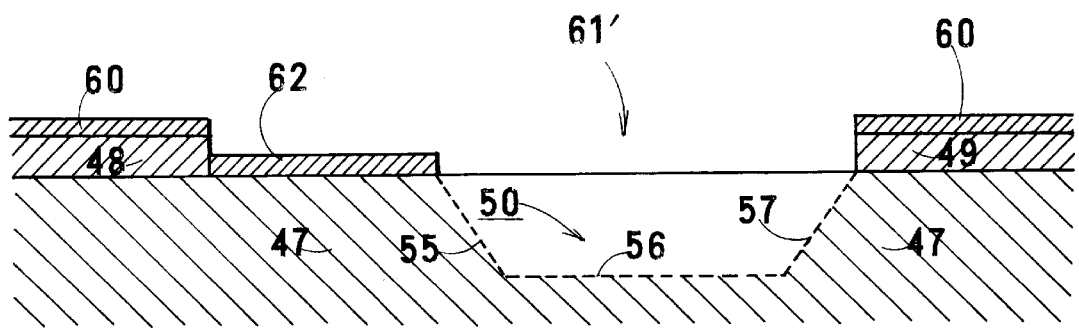
Fig. 9　EMBODIMENT 1
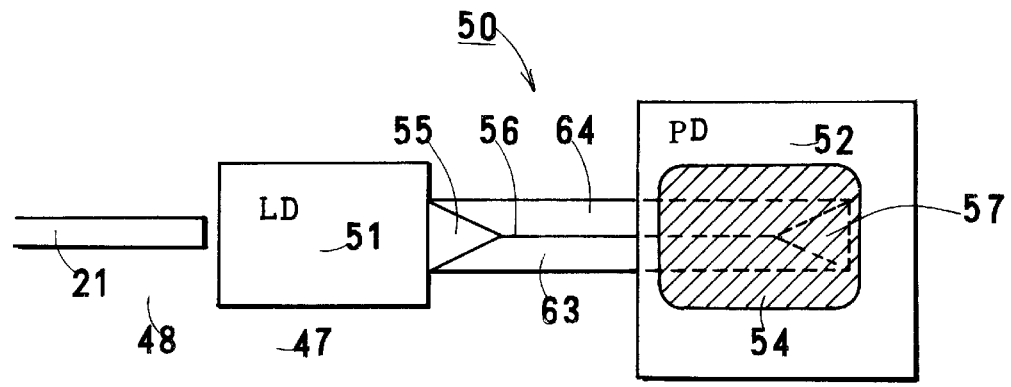
Fig. 10　EMBODIMENT 2
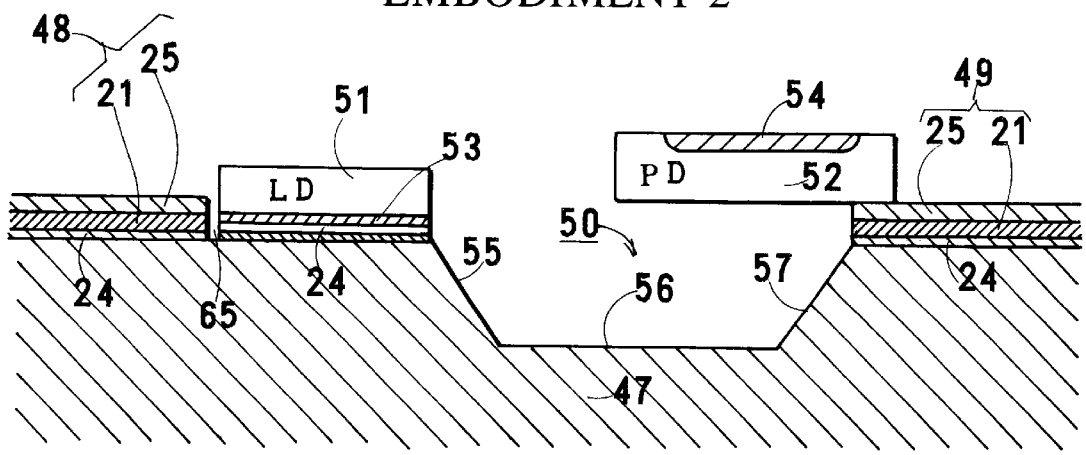

Fig. 11 EMBODIMENT 3
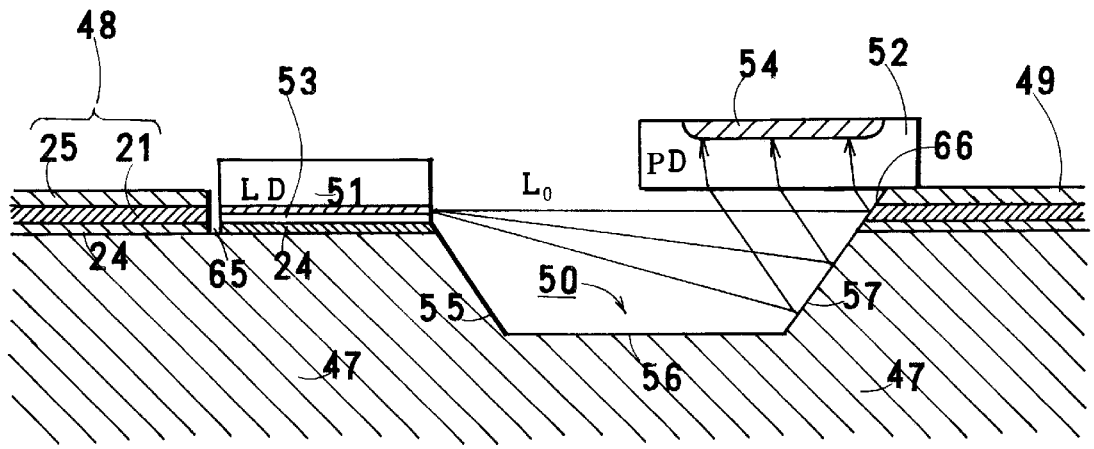
Fig. 12 EMBODIMENT 4
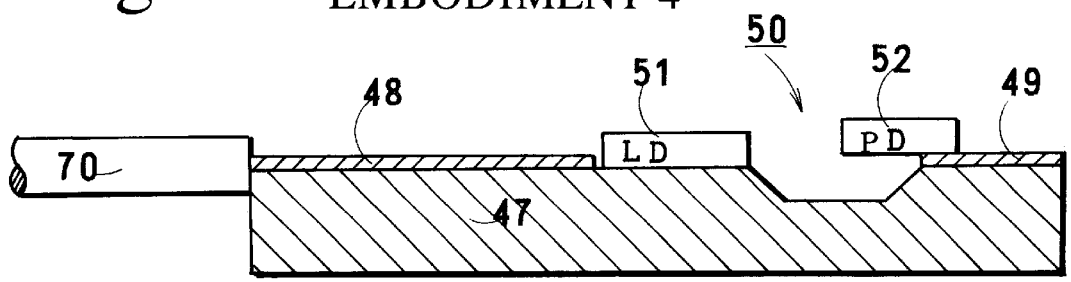
Fig. 13 EMBODIMENT 5
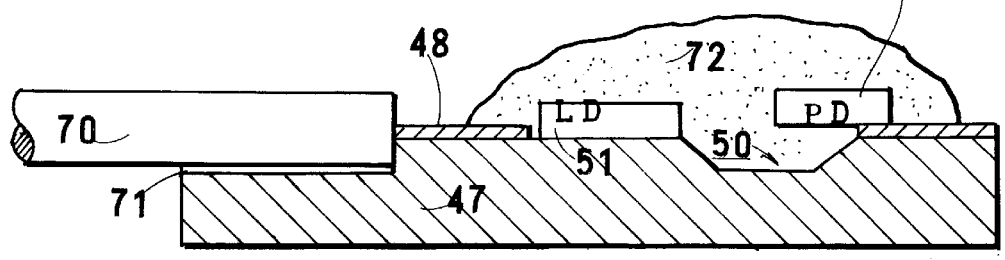

EMBODIMENT 6

EMBODIMENT 7

EMBODIMENT 7

EMBODIMENT 8

EMBODIMENT 9

EMBODIMENT 10

EMBODIMENT 11

EMBODIMENT 11

OPTICAL COMMUNICATION DEVICE

BACKGROUND OF THE INVENTION

1. Field of the Invention

This invention relates to an optical transmission device for the optical communication system or an optical transmission/receiving device combined with a receiving device.

This application claims the priority of Japanese Patent Application No.2000-12857 filed on Jan. 21, 2000 which is incorporated herein by reference.

This invention aims at an improvement of an inspection part of the light emitting device for monitoring the power of the light emitting device. The present invention can be widely applied to the communication systems making use of optical fibers as a medium. The optical signal transmission device includes an LD (laser diode) as a light emitting device. The LD power varies due to the change of temperature or the degradation by aging. The light source device has, in general, a PD (photodiode) for detecting the power of the LD and a controlling device for adjusting the driving current by feedback of the PD signal and for maintaining the output power of the LD. The PD is called a "monitoring PD". This invention proposes an improvement for the coupling of the monitoring PD with the object LD.

2. Description of Related Art

An LD module which is employed for transmitting optical signals of optical communication systems is described by referring to FIG. 1. The LD module 1 has a metallic round stem 2 with an erect mount 3. An LD chip 4 is fixed on a side of the mount 3. The LD chip 4 emits light in upward and downward directions at a certain rate. A monitoring PD chip 5 is fixed at a center of the stem 2 beneath the LD chip 4. A metal cap 6 with an opening 7 covers the LD 4, the PD 5 and the mount 3 on the stem 2. The foot of the metal cap 6 is welded on the stem 2. The light emitted upward from the LD 4 passes through the opening 7 of the cap 6. A cylindrical metallic lens holder 8 having an opening is welded upon the stem 2. The lens holder 8 supports a lens 9 at the opening. A metallic conical ferrule holder 10 is welded upon the lens holder 8.

An optical fiber 11 which carries optical signals is held by a ferrule 12 at its end. The axial hole of the ferrule holder 10 seizes the ferrule 12. Pins 13 downward project from the bottom of the stem 2. In the assembling steps, the optimum position of the lens holder 8 is determined by displacing the lens holder 8 in the xy-plane, measuring the light power at the other end of the fiber, and seeking the spot which brings about the maximum power to the fiber. The optimum position of the fiber is determined by displacing the fiber in the axial direction (z-direction), measuring the power at the other end of the fiber and fixing the fiber at the spot which maximizes the power. The operation for seeking the optimum positions of the lens holder and the fiber is called "alignment".

This invention pays attention to the relation between the monitoring PD 5 and the LD 4. The monitoring PD 5 laid behind the LD 4 always monitors the rear light of the LD 4. Thus, the monitoring PD 5 can detect the change of the rear light power of the LD 4. The front light of the LD 4 is signal light which carries signals to another terminal. The front light of the LD 4 is in proportion to the rear light. The power of the LD can be maintained at a constant level by regulating the driving current for cancelling the long-term change of the laser power level obtained by the monitoring PD.

In the example, the LD chip 4 emits light in the z-direction vertical to the stem plane (xy-plane). The LD light (z-direction) is orthogonal to the plane (xy-plane) of the package (stem 2). Thus, the structure of the LD module is three-dimensional. The rear LD light shoots the top of the PD chip 5. The PD is a top surface-incidence type. The PD 5 receives almost all of the LD rear beam. The PD 5 can gather the rear beam at high efficiency due to the three-dimensional structure. The PD 5 can obtain the strong LD rear light in the arrangement. Conveniently, this type allows the PD 5 to lie directly upon the stem 2. Since the package is made from metal, the LD module has strong points of high seal performance and low-noise property. The LD module of FIG. 1 has some advantages such as the strong monitoring light, the low-noise and the tight hermetic sealing. The current optical communication employs this metal-can type LD module as a signal transmission device.

The three-dimensional LD module is still expensive due to the high cost of the parts and the high manufacturing cost. The direction of the beam emitted from the LD is upward, i.e., vertical to the stem plane. When the LD module is mounted upon a print circuit board at the bottom pins 13, the cylindrical metal package is so tall that the LD module hinders efficient arrangement of the circuit boards in an apparatus.

Since the current LD modules have these difficulties, new two-dimensional, planar type LD modules have been intensively studied. The new planar type LD module determines the light path on a surface of a substrate and arranges devices on the surface of the substrate in two-dimensional arrangement. Since the devices and the paths are arranged on the plane, the type of the modules is called a "planar lightwave circuit (PLC)". All the light paths and all the devices lie on the surface of the substrate in the PLC modules. Although the light path extends in the z-direction in prior modules, the light paths lie on the xy-plane in the planar type devices. Various kinds of PLC modules have been proposed. FIG. 2 shows an example of a planar lightguide type LD module. A silicon (Si) substrate 14 is placed upon a package 15. A laser diode (LD) chip 16 which makes transmission signals is mounted upside down (epi-down) upon the Si substrate 14. A lightwaveguide 17 is formed along a center line on a forward half region of the Si substrate 14. A flat submount 18 having a PD 19 on the front surface is erected upon the package 15. The PD 19 is provided by mounting the PD 19 on the surface of the submount 18 and sticking the side of the submount 18 on the package 15. The PD 19 is a monitoring PD for sensing the rear light beam of the LD 16.

The lightwaveguide 17 is described by referring to FIG. 3 which is a vertically sectional view of a part of the lightwaveguide 17 and the Si substrate 14. An undercladding layer 24 of $SiO_2$ and a linear core 21 and an overcladding layer 25 of $SiO_2$ are formed on the silicon substrate (Si-bench) 14 by the sputtering or the CVD. The linear core 21 has a refractive index higher than the refractive index of the cladding layers 24 and 25. The core 21 is a $SiO_2$ part doped with a dopant which raises the refractive index, e.g., germanium (Ge). The lightwaveguide is fabricated by making the undercladding $SiO_2$ layer 24 and the Ge-doped $SiO_2$ layer 21 by, e.g., sputtering, etching unnecessary sides of the Ge-doped $SiO_2$ layer away by lithography and piling the overcladding layer 25 on the Ge-doped stripe and the undercladding $SiO_2$ layer 24 by sputtering. The striped Ge-doped core 21 is buried in the overcladding $SiO_2$ layer 25. The difference of the refractive indexes enables the core 21 to maintain the propagating light without dissipation. Since the substrate is silicon, the $SiO_2$ layers can be made by a thermal diffusion method instead of sputtering.

The core of the optical fiber 20, the core 21 of the lightwaveguide 17, the light emitting part (stripe) 22 of the LD 16 and the center of a sensing region 23 of the PD 19 lie on the same level. The monitoring PD 19 is a top surface incidence type PD. Since the submount 18 supports the PD 19 on the side, the top of the PD 19 faces the LD 16. The vertical support enables the PD 19 to receive the rear light of the LD with high efficiency. The PD 19 can obtain strong monitoring light from the LD 16. The top incidence type PD is a common PD which can be obtained easily on the market. This PLC type LD module has advantages of the mounting of the fiber and the LD on the same surface, the strong monitoring light and the use of the common PD.

The PLC module of FIG. 2 has still weak points. Since the PD has the light sensing region for receiving the LD rear light at the top, the PD should be set sideways. The submount 18 is indispensable for supporting the PD 19 sideways on the package. The submount 18 lifts the PD at a certain height from the bottom. The Si substrate 14 is necessary for raising the LD at the level of the center of the sensing region 23 of the PD 19 for introducing the LD rear light to the top of the PD 19. Namely, it is impossible for the module to put the PD 19 on the same substrate on which the LD 16 rides. The PD should be set on the package via the extra submount 18, which raises the cost of assembly. The module is not a true PLC, because the base surface of the PD is different from the base plane of the LD. The PD requires an extra operation of the alignment of the PD, which consumes a lot of time. The module of FIG. 2 making use of the top incidence type PD 19 cannot overcome the difficulty of the different heights of the LD and the PD. There are several proposals for solving the problem and for coinciding the height of the PD with the height of the LD by contriving the structure of the monitoring PD.

① T. Yamamoto, N. Yamamoto, S. Sasaki, M. Norimatsu, K. Tanaka, M. Kobayashi, K. Miura, M. Yano, "Highly uniform optical power monitor characteristics using surface mounting technology onto PLC platform", PROCEEDINGS OF THE 1997 ELECTRONICS SOCIETY CONFERENCE OF IEICE, C-3-97, p206 (1997).

② Gohji Nakagawa, Seimi Sasaki, Naoki Yamamoto, Kazuhiro Tanaka, Kazunori Miura and Mitsuhiro Yano, "High Power and High Sensitivity PLC Module Using A Novel Corner-illuminated PIN Photodiode", 1997 Electronic Components and Technology Conference, p607 (1997), in particular FIG. 10.

FIG. 4 shows the newly proposed LD module having a monitoring PD which is a strange novel PD. A flat Si substrate 26 is fitted upon a package 27. A laser diode (LD) 28 is mounted epi-side down (upside down) upon the Si substrate 26. A PD 29 for monitoring the LD power is mounted at the back of the LD 28 on the Si substrate 26. The monitoring PD 29 has strange bottom ends. A lightwaveguide 30 is made in front of the LD 28 on the Si substrate 26. The lightwaveguide 30 is a straight waveguide or a curved waveguide formed on the Si substrate. The section of the waveguide 30 is similar to the section of FIG. 3. An optical fiber 31 is stuck to the front end of the lightwaveguide 30. A core 36 of the fiber 31, a core 35 of the lightwaveguide 30 and an emitting stripe 36' are aligned at the same level. The bottom ends of the PD 29 are slantingly ground for introducing the LD back light from the slanting bottom end (angled surface) 33. The slanting cut ends are excellent contrivance for bending the incidence light upward by making use of the high refractive index of the PD substrate. The rear light emitted from the back end of the emission stripe 36' of the LD 28 shoots the slanting end 33 of the PD 29, bends upward in the PD and arrives at the light receiving region 34 of the PD 29. This strange type PD is called a "Corner-illuminated PD".

The LD front light which is emitted from the front end of the emission stripe 36' propagates in the core 35 of the light waveguide 30 and enters the core 36 of the fiber 31. The module exploits the merits of the PLC by setting the LD 28 and the PD 29 at the same level on the surface of the substrate 26. However, the module of FIG. 4 has a drawback of the difficulty of making the slanting bottom ends of the monitoring PD 29. Small tolerances of the slanting angle and the length of the edges 33 make it difficult to produce the novel PD. Since the light goes from the end 33 to the PD 29, the light power is weak at the light sensing region 34 of the PD 29. Further, it is not easy to handle the strange type PD. The difficulties of the FIG. 4 module mainly derive from the strangeness of the slanting-cut end PD (corner-illuminated PD) 29.

A third prior art monitoring PD is now clarified. The PD is also one of the end-incidence types which enables the LD light to enter the PD from the end. This is called a waveguide type PD. Another prior art LD module pursues the advantages of the PLC by making use of the light waveguide type PD.

③ M. Shishikura, H. Nakamura, S. Tanaka, Y. Matsuoka, T. Ono, T. Miyazaki, and S. Tsuji, "A symmetric double-core InGaAlAs waveguide photodiode for hybrid integration on optical platforms", LEOS'96, 9th annual meeting, 1996, 18–21, November 1996 (IEEE Laser and Electro-Optics Society 1996 Annual Meeting).

The proposed LD module makes use of an end surface incidence type (waveguide type) PD. FIG. 5 shows the prior LD module which is built on a silicon substrate (bench) 37. The silicon substrate 37 has a flat smooth surface. The silicon substrate 37 is fixed upon a package 38 (via a lead frame). The silicon substrate 37 has an LD chip 39, a monitoring PD 40 along a line upon the top. A light waveguide 41 is formed upon the silicon substrate 37 in front of the LD 39. The core 44 of the waveguide 41, the emission striped 43 and the sensing layer 46 of the PD 40 are aligned on an axial line. The LD 39 emits signal light in the forward direction and monitoring light in the rear direction. The forward signal light from the LD 39 propagates in the light waveguide 41 and the optical fiber 42 to a central station or other terminals. The backward light from the LD 39 shoots the end surface of the monitoring PD 40 and generates photocurrent in the PD which is in proportion to the forward signal light. In the LD module, the emission stripe 43 of the LD 39 is level with the sensing layer (light receiving layer) 46 of the PD 40. The straight alignment enables the LD module to dispense with extra submounts for the PD. This is an ideal configuration of the PLC devices. It seems to propose an excellent monitoring PD. The end surface incidence type PD is new and strange. ③ describes the contrivance for making the novel PD. The LD module is surpassing. ③ describes the new PD itself. The PD has a far more complex structure than the prior PDs do. The difficult manufacturing and the low yield of the new PD raise the cost of producing the LD module of ③.

The LD modules which try to make use of end-surface incidence type (waveguide type or slanting end incidence type) PDs seem to be endowed with simplified structures. But the novel PDs which allow the monitoring light to enter the PD via the end surface are difficult to produce, unstable in the performance and immature yet. At present, the PDs which can be easily obtained in the market are the top surface incidence type PDs (FIG. 1 and FIG. 2) or the bottom surface incidence type PDs. The present inventors intend to make use of the commonplace, inexpensive and reliable PDs which will promise the low cost, high reliability and high performance of the LD modules built by the PDs.

④ German Patent DE43 13 492 C1, "Anordnung zur Ankopplung eines optoelektronischen Empfangselementes an ein optoelektronisches Sendeelement", inventors; Schwanderere Bernhard, Kuke Albrecht.

As shown in FIG. 20, ④ proposes an LD module which monitors the power of the LD by a bottom surface incidence type PD. The LD module is built upon a silicon substrate 200 which has a longitudinal rear groove 204 and a front groove. The path conversion groove 204 has a front slanting wall 201, horizontal walls 202 and a rear slanting wall 203. An LD 205 is mounted upside down (epi-down) at an interposing region between the grooves upon the substrate 200. A bottom incidence type PD 206 is mounted over the elongate groove 204 on the substrate 200 in a direction slightly slanting to the axial line. The bottom incidence type means a PD having a bottom annular n-electrode with a transparent opening which allows signal light to enter the PD via the bottom opening. The light receiving region (sensing layer) 208 is made at the top center of the PD 206. Almost all of the bottom of the PD 206 faces with the elongate groove 204. The bottom of the LD 205 is on the same level as the bottom of the PD 206. The PD 206 dispenses with a submount for raising the PD 206. Since the LD 205 is fixed epi-down upon the substrate 200, the emission stripe 207 of the LD 205 is very close to the surface of the Si-substrate 200. The LD 205 emits signal light in the left direction and monitoring light in the right direction in FIG. 20. The front groove sustains a lens and a fiber. The lens converges the front signal light to the fiber. The rear light matters in the German patent. The monitoring light which is emitted in the right (rear) direction diverges in the vertical direction. The rays $L_0, L_1, L_2, \ldots$ of the rear light are depicted in FIG. 20 for showing the divergence of the LD rear light. The downward dispersing rays (209) $L_1, L_2$ and $L_3$ are reflected by the rear slanting wall 203 or the horizontal wall 202 and are introduced into the PD 206 via the bottom surface. The rays ($L_1, L_2, L_3, \ldots$) 209 are refracted upward at the bottom boundary and are guided to the light receiving (sensing) region 208 of the PD 206. The rays generate photocurrent in the monitoring PD 206 in proportional to the LD power. It is possible for the downward emitted rays to arrive at the sensing region and to make the photocurrent in the PD 206. However, the just-horizontally emanating ray $L_0$ 211 and the upward emitted rays $L_4$ do not enter the path conversion groove 204 but shoot the side of the PD 206. The horizontal and upward rays $L_0$ and $L_4$ are reflected by the side wall of the PD 206 and are extinguished in vain. The rays $L_0$ and $L_4$ are loss for the PD 206. The reason why the PD 206 inclines to the axial line is that the reflected rays do not return to the LD 205. This is a common technique for light sources making use of laser diodes. ④ is an excellent idea since the PLC LD module is based upon the use of the common, inexpensive bottom-incidence type PD.

The Inventors of the present invention, however, think that ④ has still some problems. The LD is upside down (epi-down) mounted on the base substrate 200, the emission layer (stripe) 207 is very close to the surface of the substrate. But the emission stripe 207 is still too high in comparison with the bottom of the PD 206. The emission stripe 207 is about 10 $\mu$m high from the substrate surface. The rays of the LD have continual distribution which takes the maximum for the just-horizontal ray $L_0$ (211). The strongest $L_0$ ray and the strong lays surrounding $L_0$ cannot go into the bottom of the PD. The PD 206 omits catching the strongest ray. Thus, the monitoring power of the PD of FIG. 20 is about one fifth of the stable, prior art LD module of FIG. 1. The rear light of the LD 205 is not the signal light but the monitoring light. Stronger monitoring light is more desirable for the LD module. The PD which catches only 20% of the LD back light power is unreliable yet for controlling the level of the LD driving power. Another drawback is the skew arrangement to the axial line for preventing the strongest ray from returning to the LD 205.

The PD for monitoring the power of the LD is indispensable for the LD module in the optical communication system. A top incidence type PD will bring about high part cost and high mounting cost, since the PD requires an extra submount for supporting the PD on the side. The end surface incidence type PD or the slanting end surface incidence type PD will raise the cost of manufacturing the PD itself and will reduce the yield. Both types have another drawback of the low efficiency due to the narrow aperture of the PD. Poor photocurrent of the PD decreases the reliability of the system of controlling the LD power. The bottom incidence type PD has a problem of catching only about one fifth of the LD rear light as mentioned just before. The poor monitoring current reduces the reliability also. A purpose of the present invention is to propose a light source (LD module) which enables the PD to generate larger monitoring photocurrent. Another purpose of the present invention is to provide an LD module which facilitates the installation of an LD and a PD on a substrate. A further purpose of the present invention is to provide an LD module endowed with higher reliability through the enhancement of the monitoring current.

SUMMARY OF THE INVENTION

The light source (LD module or LD/PD module) of the present invention includes a substrate having a surface, an LD mounted upon a part of the substrate for emitting forward light and rear light, a light waveguide made on a part of the substrate for guiding the forward light emitted from the LD, a path conversion groove formed behind the LD for reflecting the rear light emitted from the LD, a footboard made on the substrate for producing a level higher than the substrate surface and a monitoring PD mounted upon the footboard at the level higher than the substrate surface partially over the path conversion groove for detecting the rear light emitted from the LD.

The rear light emitted from the LD is reflected by the walls of the path conversion groove for guiding the light to the monitoring PD. The role of the footboard is to enhance the light power entering the PD by raising the level of the monitoring. PD. The rise of the PD increases the reflection of the rear light by the walls of the path conversion groove. For example, the footboard for preparing a level higher than the substrate surface is a light waveguide formed on the substrate. Since the light waveguide has a thickness of about 15 $\mu$m to 30 $\mu$m, the light waveguide can be assigned to the footboard for lifting the PD.

An example of the light source having a footboard as a light waveguide is made by forming a light waveguide on a substrate, eliminating a part of the light waveguide, forming a path conversion groove, mounting an LD upon a naked part without the light waveguide layer and mounting a PD over the path conversion groove on the light waveguide. The lift of the PD reduces the loss of the rear light. More than 50% of the rear light can go into the path conversion groove. The strongest horizontal ray $L_0$ can be reflected and be introduced into the PD for producing extra photocurrent for monitoring due to the enhancement of the PD height.

The general increase of the monitoring light power invites an increase of the photocurrent of the monitoring PD. The enlargement of the PD output raises the preciseness of controlling the LD power for cancelling long term degradation of the LD. The increase of the monitoring PD output enhances the freedom of designing the LD module. The example can exempt this invention from adding an extra step by appropriating the light waveguide which is inherent to the waveguide type LD module as the footboard of the monitoring PD. However, the waveguide is only an example for the footboard. Of course, it is possible to form another footboard than the light waveguide. There is a variety of the material and the shape of the footboard.

The present invention includes a substrate, a light waveguide layer with a core made on the substrate, a path conversion groove perforated along the core on the substrate, an LD bonded on a naked portion of the substrate at an end of the core and a PD fitted over the path conversion groove on the light waveguide layer.

The light waveguide layer is formed for guiding signal light from the LD to an external fiber on the substrate. It is easy to coat all the surface of the substrate with the light waveguide layer which consists of an undercladding, a core and an overcladding. A part of the light waveguide layer or a part of the overcladding layer is facilely eliminated by photolithography. The LD is bonded upon the naked substrate or the naked undercladding at an end of the core. The emission stripe of the LD is laid at the same level as the core in the light waveguide layer. The front light emitted forward from the LD enters the core of the waveguide layer. The rear light emitted back from the LD is reflected by the path conversion groove and is guided into the monitoring PD. The path conversion groove couples the LD and the monitoring PD. The LD lies on the naked substrate or on the undercladding layer. The PD is bonded on the waveguide layer as a footstep. The PD is higher than the LD by the thickness of the waveguide layer or the overcladding layer. Since the PD is higher than LD, the path conversion groove can introduce more than 50% of the rear emitted light from the LD to the PD. An increase of the monitoring photocurrent enhances the preciseness of the system of controlling the LD power and raises the freedom of designing the optical and electric circuits. The light waveguide layer has two roles of guiding the LD signal front light to the external fiber and of lifting the PD as a footstep.

The gist of the present invention is to raise the PD by the waveguide layer as a footstep for increasing the PD monitoring photocurrent. The PD can receive more than 50% of the LD rear light due to the lift of the PD. The function of the path conversion groove, for example, a V-groove is described in detail by referring to FIG. 28 to FIG. 31. In the case of a silicon (001) single crystal, the V-groove can easily be dug by the anisotropic etching.

FIG. 28 is an oblique view of the V-shaped path conversion groove 50. FIG. 29 is the section of the same path conversion groove 50. The top surface is a silicon (001) plane. The V-groove 50 has four slanting walls: a rear slanting wall 57, a front slanting wall 55 and side walls. The crossing line of the side walls is the bottom line 56. The bottom line 56, the front slanting wall 55 and the side walls are insignificant as a mirror for reflecting the LD rear light. "L" is the emission point which is the rear end of the emission stripe of the LD. Since the LD is epi-side down bonded on the naked substrate, the height of L is nearly equal to the substrate level. Crossing lines of extensions of four slanting walls and a horizontal plane including light source point L are denoted by ABGK. A, B, G and K are virtual points on the top surface of the substrate. Rigorously speaking, the top corner points of the groove are slightly lower than A, B, G and K. However, it is assumed that the groove is defined by ABGKOC for simplifying the description. Here, two bottom points are denoted by O and C. The substrate should be selected from silicon (Si), GaAs, InP, other semiconductors, ceramics or plastics. Ceramic or plastic substrates allow the path conversion groove to take an arbitrary shape with arbitrary slanting angles. Here, the reflection mode is described for the groove formed on a silicon (001) single crystal substrate as an example.

Then, ΔKOG is a rear slanting wall 57 $M_0$ ($\bar{1}11$). ΔACB is a front slanting wall 55. Trapezoid ACOK is a left side slanting wall $M_1$ ($1\bar{1}1$). Trapezoid BCOG is a right side slanting wall $M_2$ ($1\bar{1}1$). CO is a bottom line [110]. BA is a front end line [$\bar{1}10$]. KG is a rear end line [$\bar{1}10$]. AK is a left side line [110]. BG is a right side line [110]. The most significant mirror is the rear slanting wall $M_0$ (ΔKOG) (111). The slanting angle ∠BAC or ∠ABC of the side walls is 54.7 degrees in the case of silicon anisotropic etching. The slanting angle of the front wall and the rear wall is also 54.7 degrees. The bottom angle ∠BCA is 70.5 degrees. The light source point L is the middle point of the side AB. "S" is a mirror image point of L regarding $M_1$. "H" is a mirror image point of L with regard to $M_2$ in FIG. 29. H and S are deemed as virtual light source points extended by $M_1$ and $M_2$. Namely, there are three light source points L, H and S.

The beams starting from L, H and S should rigorously be traced on the basis of the beam tracing calculation method. A simple geometric optics can clarify the advantage of the lift of the PD higher than the LD for reinforcing the monitoring power.

FIG. 30 is a section of the groove extended symmetrically with regard to the rear slanting mirror $M_0$ which plays the main role for transferring the LD power to the PD when the level difference h between LD and PD is 0 (h=0). The prior art ④ belongs to FIG. 30. L' is a mirror image point of L regarding $M_0$. H' and S' are mirror image points of H and S regarding $M_0$. Hatched PD' is a mirror image of the PD 52 regarding $M_0$. The rays starting from the sources L, H and S and reflected by $M_0$ can be replaced by the straight rays starting from the virtual sources L', H' and S'.

The rays are refracted at the boundary of the PD and the outer resin in accordance with Snell's law. The influence of the refraction should be conveniently eliminated by reducing the PD size. The PD substrate has a refractive index $n_1$ and the outer resin (e.g., silicone resin) has a refractive index $n_2$. The ratio $n_1/n_2$ is denoted by n (=$n_1/n_2$). The height of the PD is reduced to 1/n to the bottom. The bold line shows the reduced virtual PD which allows the boundary to replace the refracted rays by straight lines.

In FIG. 30 (h=0, prior art ④), L' emits three virtual rays $L_0$, $L_1$ and $L_4$. Since h=0, the strongest $L_0$ is disturbed by the side of the PD'. The upward ray $L_4$ is also shielded by the side of the PD'. The downward ray $L_1$ can arrive at the sensing region 54 of the PD. $H_4$ and $S_4$ from the side virtual sources H' and S' reach the PD. But the light from the side virtual sources is weak. Since the main ray $L_0$ is rejected by the PD, the light power which can arrive at the sensing region 54 is far less than 50% of the LD rear light.

In FIG. 31 (h>0, present invention raising the PD), L' emits five virtual rays $L_0$, $L_2$, $L_3$, $L_4$ and $L_5$. Since h>0, the strongest $L_0$ is not disturbed by the side of the PD'. The PD monitoring power is enhanced by the incidence of the horizontal ray $L_0$. The slightly upward ray $L_4$ is also absorbed by the sensing region 54 of the PD, because the PD recedes upward. The downward ray $L_2$ and $L_3$ can also arrive at the light receiving region 54 of the PD. Since the strongest main ray $L_0$ is accepted by the PD, the light power which can arrive at the sensing region 54 is more than 50% of the LD rear light. The upheaval of the PD increases the LD power attaining to the monitoring PD. The increase of the monitoring power enables the module to control the LD power more precisely. The freedom of designing the optical parts and the electric circuits is also enhanced.

BRIEF DESCRIPTION OF THE DRAWINGS

FIG. 8 is a sectional view of a substrate at an intermediate step next to FIG. 7 of etching away only the light waveguide layer via the opening of the first mask and making a second mask pattern on a part of the revealed substrate in Embodiment 1.

FIG. 9 is a plane view of a substrate at an intermediate step next to FIG. 8 of etching away the substrate via the second mask pattern, making a path conversion groove, getting rid of the second mask pattern, mounting an LD on the revealed substrate in front of the path conversion groove and positioning an bottom incidence type PD over the groove on the waveguide layer in Embodiment 1.

FIG. 10 is a sectional view of Embodiment 2 which lays the LD on the undercladding of a lightwaveguide instead of eliminating whole of the waveguide for insulating the LD from the substrate.

FIG. 11 is a sectional view of Embodiment 3 which is made by employing a quartz glass as a substrate, forming the path conversion groove by a mechanical means and polishing the front end of the light waveguide layer under the PD slantingly as well as the rear slanting wall of the groove for reflecting LD rays by the slanting end of the waveguide.

FIG. 12 is a sectional view of Embodiment 4 which has an optical fiber stuck onto the end of the substrate for introducing light propagating in the light waveguide into the optical fiber.

FIG. 13 is a sectional view of Embodiment 5 which has a V-groove at a front part of the substrate, an optical fiber fixed in the V-groove and a transparent resin covering the LD and the PD as an LD module.

DETAILED DESCRIPTION OF THE PREFERRED EMBODIMENTS

Figure 6:
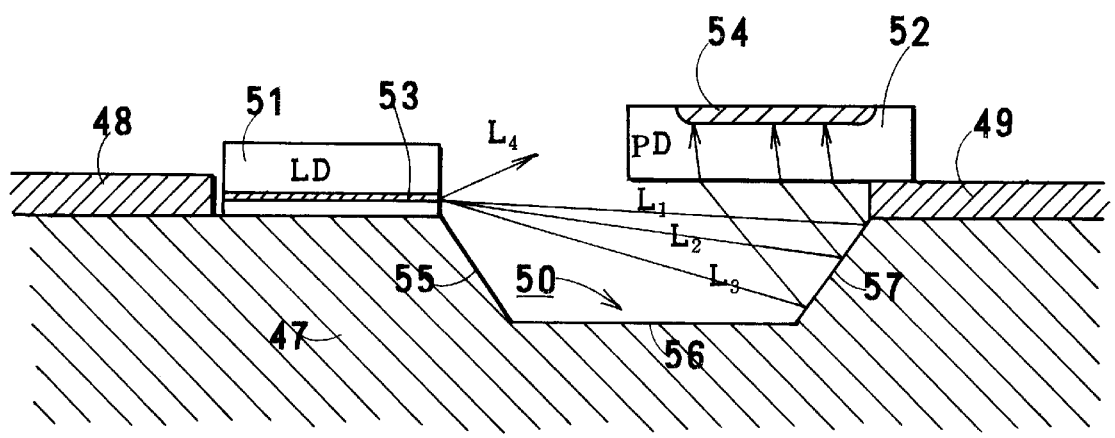
FIG. 6 is a vertical sectional view of a light source (LD module) having an LD, a path conversion groove and a monitoring PD on a substrate as Embodiment 1 of the present invention.

FIG. 6 shows a section of a fundamental structure of the (light source) LD module of the present invention. The module is built upon a flat substrate 47. The substrate 47 is made from silicon crystal or ceramics. The substrate 47 has light waveguide layers 48 and 49 on the top surface. As demonstrated by FIG. 3, the light waveguide layer consists of the undercladding 24 ($SiO_2$) on the substrate 14, the core 21 (Ge-doped $SiO_2$) and the overcladding 25 ($SiO_2$). The core 21 has a function of guiding the signal light due to the refractive index higher than the surrounding claddings. The claddings 24 and 25 enclose and protect the core 21. The height and the width of the core are determined by the wavelength of the light passing through. The signal light is near infrared light, for example, of 1.3 $\mu$m to 1.55 $\mu$m. The total thickness of the light waveguide layer is about 15 $\mu$m to 30 $\mu$m. In FIG. 6, a path conversion groove 50 is formed along a central line on the substrate by etching or mechanical dicing. The perforation of the path conversion groove 50 divides the top surface of the substrate into a front part and a rear part. A portion of the light waveguide layer is eliminated by a length nearly equal to the LD length on the front part for revealing the surface of the substrate in the vicinity of the path conversion groove. An LD 51 with an emission stripe 53 is upside down (epi-down) mounted upon the naked substrate between the path conversion groove 50 and the light waveguide 48. The emission stripe 53 coincides with the core of the light waveguide 48 for allowing the front light emitted from the LD 51 to go into the core. A bottom incidence type PD 52 is epi-up mounted over the groove upon the light waveguide layer 49. The PD 52 spans the path conversion groove 50. Both sides of the front bottom of the PD are glued to the light waveguide layer 49. But the center of the front bottom of the PD is revealing.

The signal light (front light) emitted from the LD 51 propagates in the core of the light waveguide 48 and a core of an optical fiber (not shown in FIG. 6) following the light waveguide 48. The monitoring light (rear light) is emitted from the emission stripe 53 of the LD 51 nearly horizontally, is reflected by the walls of the path conversion groove 50 and is introduced into the PD chip 52 via the bottom and refracted toward a light receiving region (sensing part) 54. The rear light produces a photocurrent in proportion to the LD light power. Thus, the LD power is detected. The feedback system controls the LD driving circuit for maintaining the LD power at a constant level.

The present invention resembles prior art ④ (German Patent DE 43 13 492 C1). However, the present invention has inherent features and advantages over ④. A first feature is lift of the PD over the level of the LD. The light waveguide is utilized as a footstep of raising the PD. The thickness of the light waveguide layer is 15 $\mu$m to 30 $\mu$m. Thus, the PD is higher than the LD by the thickness (15 $\mu$m to 30 $\mu$m) of the waveguide layer. Rays included in the rear light are denoted by $L_1$, $L_2$, $L_3$, and $L_4$ in FIG. 6. The horizontal and downward rays $L_1$, $L_2$, and $L_3$ are reflected by a slanting wall 57 of the path conversion groove 50 up to the PD 52. The upward ray $L_4$ does not shoot the wall of the groove 50 and fails in going in the PD 52. Since the PD 52 is positioned at a point higher than the LD 51, the path conversion groove 50 enables the PD 52 to gather stronger power than ④. Effective catch of the LD back light increases the monitoring current of the PD 52. The higher-position of the PD is caused by the appropriation of the light waveguide 49 as a footstep for raising the PD. Since ④ has no light waveguide layer, ④ cannot lift the PD by the waveguide layer. A second feature of the present invention is omission of alignment and lens for the monitoring PD, because the rear light of the LD is effectively reflected by the walls of the path conversion groove. The omission of the alignment and the lens lowers the cost of parts and the cost of production. The use of the prevalent and inexpensive bottom incidence type PD decreases the PD cost also. A third feature is the possibility of mounting the PD chip and the LD chip directly on the substrate without a submount. The elimination of the submount also decreases the cost of making the LD module.

[Embodiment 1 (Direct LD Bonding on Naked Substrate; FIG. 6–FIG. 9)]

Embodiment 1 is demonstrated by FIG. 6 which has been already explained. The steps of production are described now by referring to FIG. 7 to FIG. 9. Embodiment 1 is favorable for highly insulating substrates, since the LD chip is directly bonded on the substrate. The substrate is, for example, a (001) silicon single crystal substrate or a ceramic substrate. The ceramic substrate is an insulator which is convenient for insulating the parts electrically. On the other hand, the silicon single crystal substrate has an advantage of making the path conversion groove by anisotropic etching facilely. In the case of the ceramic substrate, the path conversion groove can be formed by mechanical dicing.

At first, a light waveguide layer (48 and 49) having a straight core (FIG. 3) is uniformly piled upon the substrate 47.

Figure 3:
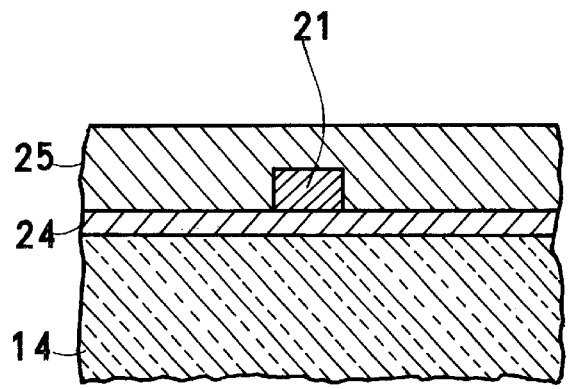
FIG. 3 is a sectional view of a $SiO_2$ light waveguide fabricated upon a silicon substrate.

The light waveguide layer consists of an undercladding layer 24, a linear core 21 and an overcladding 25, as shown in FIG. 3. The core sandwiched between the overcladding 25 and the undercladding 24 is produced by doping $SiO_2$ with Ge which raises the refractive index of $SiO_2$. The claddings and the core are made by the sputtering method, the blaze deposition method, or the CVD method. As described once, the light waveguide layer is formed by the steps of piling the undercladding ($SiO_2$) layer 24 and the core (Ge-$SiO_2$) layer 21 on the substrate, removing the core layer except a central stripe and piling the overcladding layer on the undercladding and the core. The total thickness of the light waveguide layer is about 15 $\mu$m to 30 $\mu$m.

Figure 7:
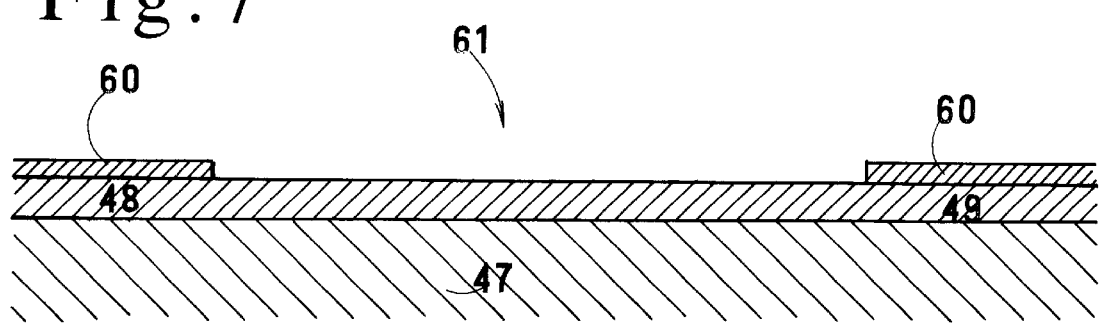
FIG. 7 is a sectional view of a substrate at an early step of making a light waveguide layer on the substrate and covering the waveguide layer with a first mask pattern (photoresist) having an opening in Embodiment 1.

A first mask pattern 60 having a first opening 61 is made by painting a photoresist on the light waveguide layer, exposing the photoresist through a photomask having an opening pattern, developing the photoresist and obtaining a first mask with the first opening 61 which corresponds to the LD base and the path conversion groove, as shown in FIG. 7. Then, the exposed light waveguide layer is selectively etched away through the first resist mask 60 by the reactive ion etching (RIE). Otherwise, the wet etching by hydrofluoric (HF) acid is also available for removing the exposed light waveguide layer. The substrate surface reveals only at the mask aperture, because the waveguide layer is partially removed.

At the step, the first resist mask 60 is maintained on the light waveguides 48 and 49. A second mask 62 of a resist is further deposited upon the revealed portion of the substrate which is allocated to the base of the LD. In the state, the light waveguide (48 and 49) is covered with the first mask pattern 60. The part for the LD on the substrate is protected with the second mask pattern 62. There is still a second opening part 61' which is not covered with the masks 62 nor 60. The second opening part 61' is a rectangular region which has the same size of a path conversion groove 50. In the case of a (001) Si substrate, the groove 50 is formed by the anisotropic etching. The anisotropic etching means the etching in which the etching velocities are different for different crystallographical directions. The anisotropic etching is treated with an etchant having the slowest speed in the {111} plane. Since the (001) surface has four crossing planes {111}. {111} means an assembly of $(1\bar{1}1)$, $(111)$, $(\bar{1}11)$ and $(\bar{1}1\bar{1})$ planes. The use of the anisotropic etchant naturally produces a groove having $(1\bar{1}1)$, $(111)$, $(\bar{1}11)$ and $(\bar{1}1\bar{1})$ planes which meet at a certain common angle with each other. The section of the groove 50 is denoted by dotted line in FIG. 8. The path conversion groove 50 is available as it is. But it is preferable to evaporate gold or aluminum films on slanting walls (55, 57, 63 and 64) for enhancing the reflection rate. Instead of the metal films, dielectric films are also effective to strengthen the reflection. In the case of the anisotropic etching of the silicon substrate, the inclinations of the slanting wall to the top surface are 54.7 degrees. These structures of the path conversion groove 50 are common to the following embodiments.

Then, both the first resist mask pattern 60 and the second mask pattern 62 are removed. The light waveguides 48 and 49 and the substrate 47 reveal. The revealed substrate is provided with a metallized base pattern for bonding an LD 51 by printing, evaporation or sputtering. The rear revealed light waveguide layer 49 is provided with another metallized base pattern for bonding a PD 52. And wiring patterns are made on other parts of the light waveguide layers simultaneously.

Then, the LD chip 51 is bonded on the LD-base pattern on the substrate 47. The LD chip is, for example, a 1.3 μm-MQW (Multiquantum Well)-LD having an InGaAsP active layer. The LD has, e.g., a 300 μm length, a 300 μm width and a 100 μm thickness. Since the LD 51 is bonded upside down (epi-down) on the substrate 47, an emission (layer) stripe 53 of the LD 51 is quite close to the substrate surface. The bottom incidence type PD chip 52 is bonded on the PD-base pattern on the rear light waveguide 49. The size of the PD chip is, for example 550 μm (length)×550 μm (width)×200 μm (thickness). The PD has a light receiving layer (p-region) 54 at the top. The top light receiving region 54 of the PD 52 is a rectangle of 250 μm×250 μm in the example. The top p-region is fully covered with a p-electrode. The light receiving region 54 can take a circle, an ellipse, or another arbitrary shape. This invention succeeds in reflecting more than half of the rear light of the LD by the groove 50 and introducing the light into the bottom of the PD 52.

Figure 1:
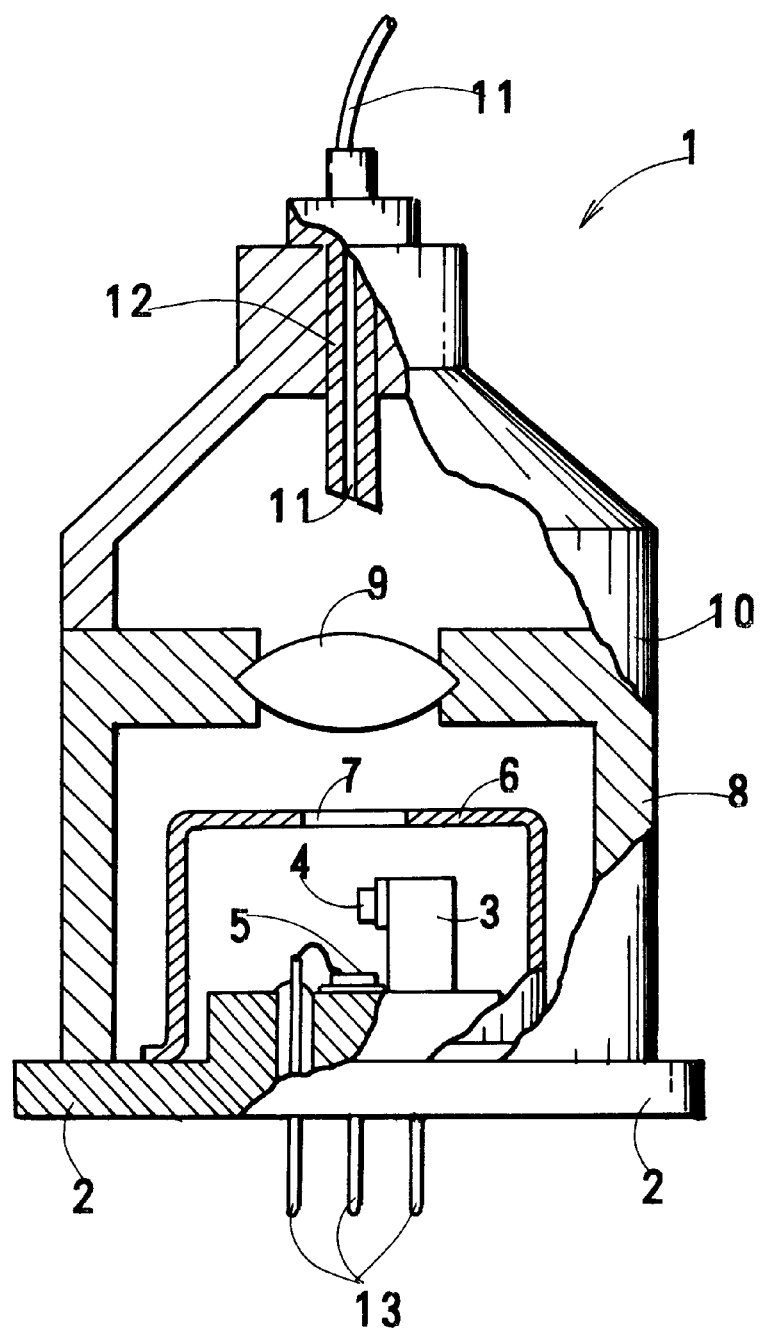
FIG. 1 is a vertical sectional view of a vertical metal packaged LD module as prior art.
Figure 2:
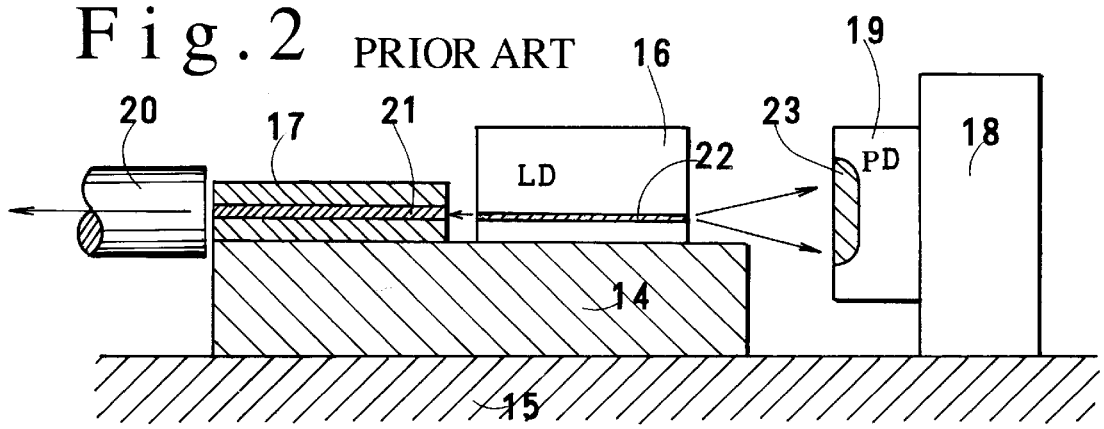
FIG. 2 is a vertical sectional view of a PLC type LD module having a silicon substrate, an LD, a waveguide mounted on the substrate and a top surface incidence type monitoring PD fitted on a submount erected on the substrate as prior art.
Figure 4:
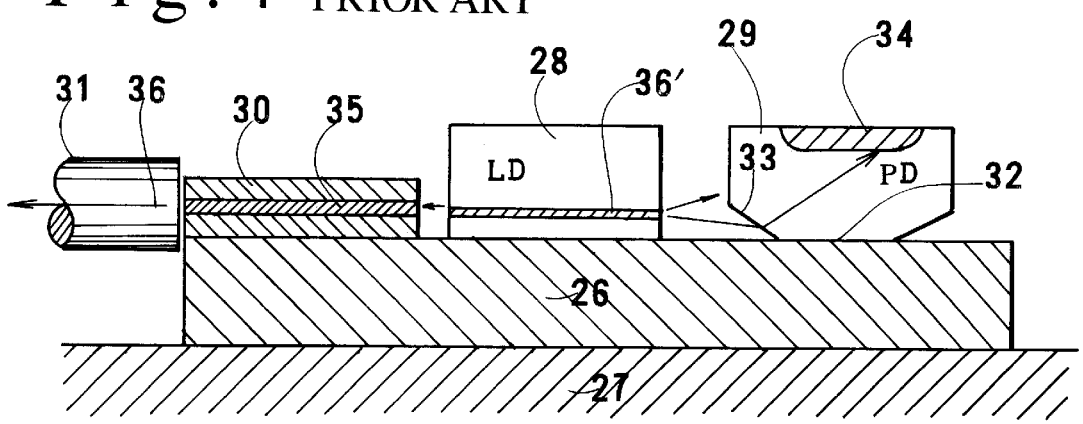
FIG. 4 is a vertical sectional view of a PLC type LD module having a silicon substrate, an LD mounted, a waveguide made on the substrate and a slanting end wall type monitoring PD fitted on the same substrate as prior art.
Figure 5:
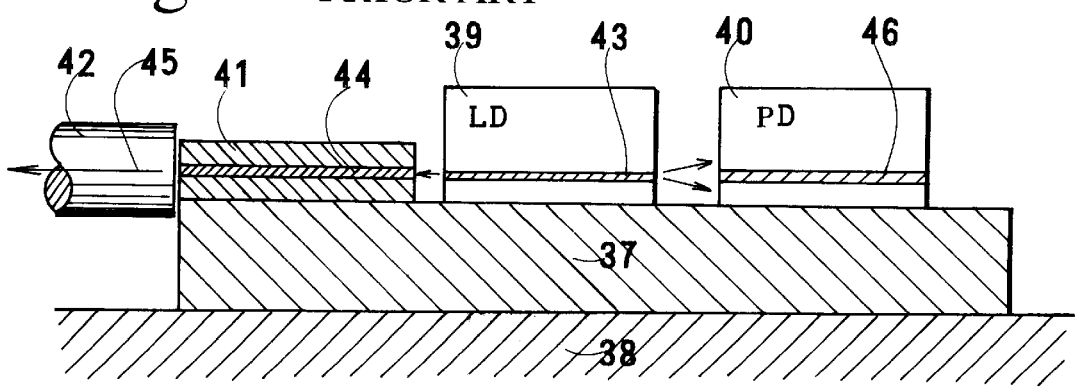
FIG. 5 is a vertical sectional view of a PLC type LD module having a silicon substrate, an LD mounted, a waveguide made on the substrate and a waveguide type monitoring PD upside down (epi-down) fitted on the same substrate as prior art.

The lift of the PD over the substrate level enables Embodiment 1 to introduce the strongest horizontal ray $L_1$ into the PD 52. A measurement confirms that Embodiment 1 obtains about 50% of the photocurrent of the top incidence type PD 19 mounted on the side wall of the submount which is shown in FIG. 2. The top incidence type PD can receive nearly all the rear-emission light of the LD. This means that Embodiment 1 can gather about 50% of the rear light of the LD. Though Embodiment 1 has described a device on the silicon single crystal platform (Si-substrate), other semiconductor substrate such as GaAs substrates or InP substrates can be used for the device of the present invention. Further, ceramics ($Al_2O_3$, SiN, AlN etc.) or glass ($SiO_2$ etc.) is available for the material of the substrate. Insulating ceramic material is favorable when the LD is directly bonded on the naked substrate. In the case of Si-bench (platform or substrate), high resistivity (i—Si) silicon should be selected for the substrate. If the insulation is insufficient, a thin insulating film should be provided on the LD base part of the Si-substrate.

[Embodiment 2 (LD Bonding on Undercladding; FIG. 10)]

Since Embodiment 1 directly bonds the LD on the substrate (via a metallized base), the substrate should have high resistivity for insulating the LD stripe electrode from the substrate electrically. If the substrate has poor insulation, the LD should be insulated positively by some means from the substrate. Fortunately, the light waveguide enables this invention to insulate the LD by a part (undercladding) of the light waveguide itself. FIG. 10 shows Embodiment 2 which leaves a part of the undercladding 24 at the LD base on the substrate and bonds the LD 51 on the undercladding ($SiO_2$) 24 of the LD base. The undercladding 24 which is made of $SiO_2$ insulated the LD from the substrate. The residual unetched undercladding allows Embodiment 2 to employ a Si-substrate (n-type or p-type) of medium conductivity. A core of the waveguide should lie along an extension of the emission stripe 53 of the LD 51. The gap 65 between the waveguide 48 and the LD 51 should be as short as possible for raising the coupling efficiency. The gap between the LD level and the PD level is reduced by the thickness of the undercladding 24. But the level gap can be maintained by increasing the thickness of the overcladding 25.

[Embodiment 3 (Quartz Glass Substrate; Dicing; FIG. 11)]

Embodiment 3 adopts a quartz glass substrate as a substrate 47. FIG. 11 shows the section of Embodiment 3. The quartz glass is amorphous. The anisotropic etching which is effective in the case of silicon substrates cannot be applied to the quartz glass. Then, mechanical dicing is employed for making the path conversion groove 50 on the quartz glass substrate 47. The rear light waveguide 49 is also ground into an oblique end 66 having the same slanting angle as the groove wall 57 by the mechanical dicing together with the glass substrate 47. The slanting angle is determined to be an arbitrary angle due to the dicing unlike the silicon anisotropic etching which uniquely produces a 54.7 degrees inclination. The reflection rate can be enhanced by plating or evaporating gold or other metals into films on the four walls of the path conversion groove 50. In FIG. 11, the LD 51 is mounted upon the residual undercladding 24. But the undercladding 24 can be eliminated, since the quartz glass is an insulator having the function of insulating the LD without the undercladding 24. In the example, the undercladding 24 is left unetched for adjusting the difference between the LD level and the PD level. The advantage of Embodiment 3 is the oblique end 66 of the rear light waveguide 49 produced by the mechanical dicing. The etching cannot make such an oblique end 66, because the light waveguide is polycrystalline or amorphous. The oblique end 66 enables Embodiment 3 to reflect the strongest horizontal ray $L_0$ in the LD rear light and to introduce it into the PD 52. An arrival of the strongest $L_0$ increases the monitoring photocurrent of the PD 52. An experiment confirms that Embodiment 3 makes a higher photocurrent by about 10% than Embodiment 1 and Embodiment 2.

[Embodiment 4 (Face to Face Coupling with Fiber; FIG. 12)]

Embodiments 1 to 3 include only the disposition of the LD and the monitoring PD. FIG. 6 to FIG. 11 demonstrate the inner structures only. However, the LD module should be coupled with an optical fiber which carries transmission signals riding on the LD front light. An optical fiber should be glued to the substrate. There are some varieties for coupling the substrate with the fiber.

FIG. 12 shows Embodiment 4 which sticks an end of a fiber 70 on the end of the substrate 47 with a resin. The end of the fiber 70 faces the end of the substrate. The core of the fiber 70 coincides with the core of the light waveguide 48 on the substrate 47. The light emitted from the front end of the LD 51 goes into the core of the waveguide 48 and travels in the core of the fiber 70. The other structures are similar to the preceding embodiments. The PD 52 laid on the waveguide 49 formed on the substrate 47 is higher than the LD 51 lying on the substrate 47.

[Embodiment 5 (V-groove Coupling with Fiber; FIG. 13)]

FIG. 13 shows Embodiment 5 which holds a fiber 70 in a V-groove 71 dug at the front region of the substrate 47. The fiber 70 is inserted into the V-groove 71 and glued with an adhesive. The rear end of the light waveguide 48, the LD 51 and the PD 52 are covered with a transparent resin 72. The "transparency" means that the resin is transparent for the light (e.g., 1.3 $\mu$m) emitted from the LD 51. It is preferable to select a resin having a refractive index close to the refractive index of the waveguide 48 for reducing reflection or scattering. The LD front light passes the resin 72 and enters the fiber 70. The LD back light passes the resin 72, changes the path in the groove 50 and enters the PD 52 via the bottom. Besides reducing the reflection, the transparent resin 72 has another important role of preventing an opaque epoxy resin enclosing the whole device from jamming the paths between the LD 51 and the PD 52 and between the LD 51 and the waveguide 48.

The transparent resin has a further role. A silicone transparent resin has a refractive index of 1.4 to 1.5 for the LD light higher than 1 which is the refractive index of air. The refractive index higher than air endows the resin with the function of converging the LD back light into the PD and of reducing the reflection at the boundaries. Thus, the transparent resin has the mechanical function of protecting the chips 51 and 52 and the optical function of reducing the reflection and converging the light. The protection by the resin can be applied also to Embodiments 1 to 4.

Figure 14:
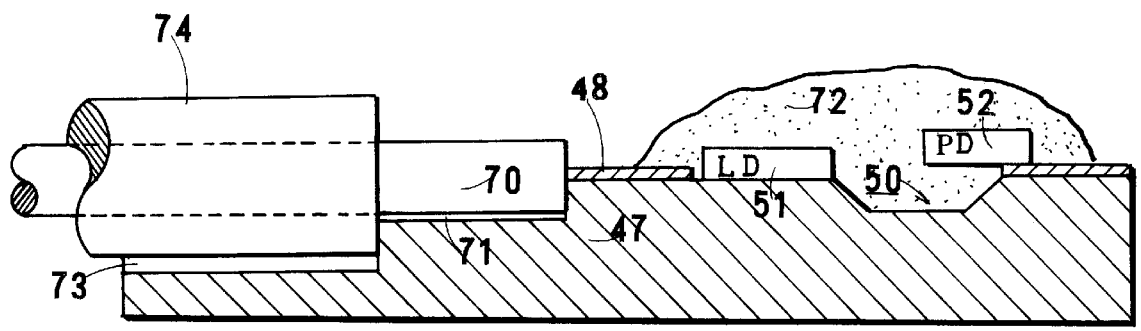
FIG. 14 is a sectional view of Embodiment 6 which has a shallower V-groove and a deeper V-groove at a front part of the substrate, an optical fiber fixed in the shallower V-groove, a ferrule fixed in the deeper V-groove and a transparent resin covering the LD and the PD.

[Embodiment 6 (Two V-grooves Coupling with Fiber and Ferrule; FIG. 14)]

FIG. 14 shows Embodiment 6 having a smaller V-groove 71 and a bigger V-groove 73 along the central line at the front region of the substrate 47. A ferrule 74 is attached to the front end of a fiber 70. The fiber 70 (core+cladding: 125 $\mu$m$\phi$) is inserted and glued in the smaller V-groove 71. The ferrule 74 is inserted and glued in the larger V-groove 73. The front light emitted from the LD 51 goes in the waveguide 48, enters the fiber core and propagates in the fiber 70. Similarly, to the former embodiments, a transparent resin 72 covers the LD 52, the PD 52, the path conversion groove 50 and a part of the waveguide 48 for protecting these parts and prohibiting the reflection at the boundaries. The PD 52 is higher than the LD 51 due to the waveguide footstep.

Figure 15:
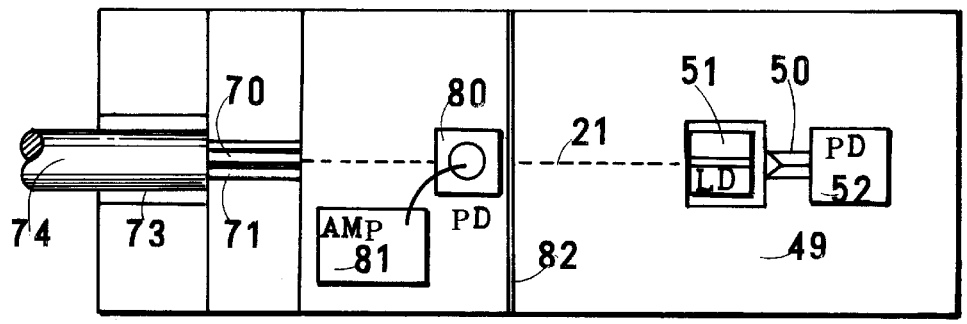
FIG. 15 is a plan view of Embodiment 7 which has a shallower V-groove and a deeper V-groove at a front part of the substrate, an optical fiber fixed in the shallower V-groove, a ferrule fixed in the deeper V-groove and a receiver PD, an amplifier mounted at the center of the substrate and an LD mounted at a rear part of the substrate as an LD/PD module.
Figure 16:
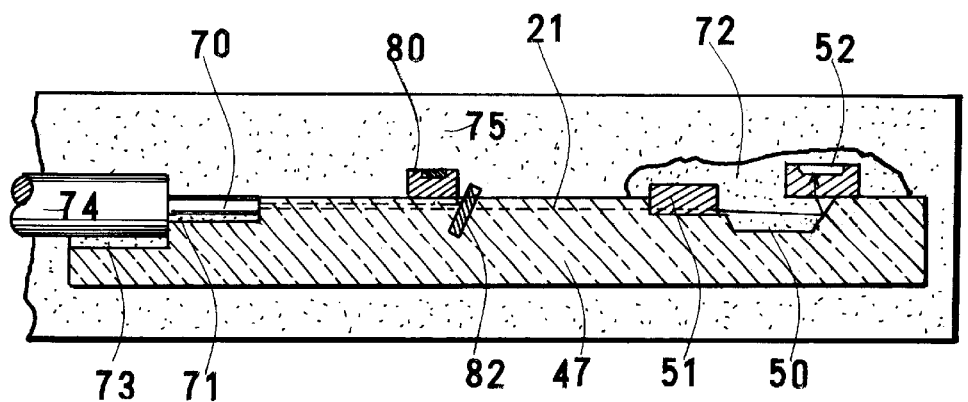
FIG. 16 is a sectional view of Embodiment 7 which has a shallower V-groove and a deeper V-groove at a front part of the substrate, an optical fiber fixed in the shallower V-groove, a ferrule fixed in the deeper V-groove and a receiver PD, an amplifier mounted at the center of the substrate, an LD mounted at a rear part of the substrate, a transparent resin covering the LD portion and an epoxy resin enclosing the substrate as a plastic package.

[Embodiment 7 (LD/PD Module with Bottom Incidence Type PD; FIG. 15 and FIG. 16)]

All the embodiments described hitherto are transmitting devices (LD modules). This invention is applicable to a transmitting/receiving device (LD/PD module) having a transmitting part and a receiving part. FIG. 15 and FIG. 16 depict a transmitting/receiving module as Embodiment 7 which is built on a long rectangular silicon substrate 47. The silicon substrate 47 has a front lower part without waveguide layer and central and rear higher parts with a waveguide layer ($SiO_2$) 49. The waveguide layer 49 has a central core 21 which carries light signals in two directions. A part of the waveguide layer is eliminated at a rear portion and is assigned to an LD base with a metallized pattern (not shown) for mounting an LD 51. Behind the LD 51, a path conversion groove 50 is perforated. A PD 52 for monitoring the LD power is fitted on a metallized pattern (not shown) upon the waveguide layer 49 over the groove 50. A transparent resin 72 protects the PD 52 and the LD 51 and fills the groove 50. On the front stepped region, a larger V-groove 73 and a smaller V-groove 71 are formed for sustaining a ferrule 74 and a fiber 70. The core of the fiber 70 is directly in contact to the core 21 of the waveguide layer 49.

At a central part, a bottom incidence type PD 80 for receiving signals is bonded upon a metallize on the waveguide layer above the core 21. The signal receiving PD 80 should not be confused with the monitoring PD 52. In the vicinity of the PD 80, an amplifier IC (AMP) chip 81 is bonded for amplifying the received photocurrent of the PD 80. A slanting lateral groove is formed next to the receiving PD 80. The slanting groove maintains a WDM (wavelength division multiplexer) filter 82 which intersects the core 21 of the waveguide layer 49. The WDM filter 82 has wavelength selectivity for allowing the LD light (transmitting light) to pass but reflecting the receiving light. The transmitting signal light emitted forward from the LD 51 travels in the core 21, passes the WDM filter 82, propagates in the core again and goes into the fiber 70. The receiving signal light emitted backward from the fiber 70 is injected into the front core 21, is reflected by the WDM 82 and is introduced into the PD 80 for making receiving photocurrent. The substrate 47 is bonded on a leadframe (not shown) with pins. Embodiment 7 is a simultaneous, bidirectional LD/PD module. The whole of the substrate 47, the chips 51, 52, 80 and 81, the end of the ferrule 74 and the fiber 70 and the leadframe are molded with a fixation resin (e.g., epoxy resin) 75. A plastic-molded type LD/PD module is obtained.

Figure 17:
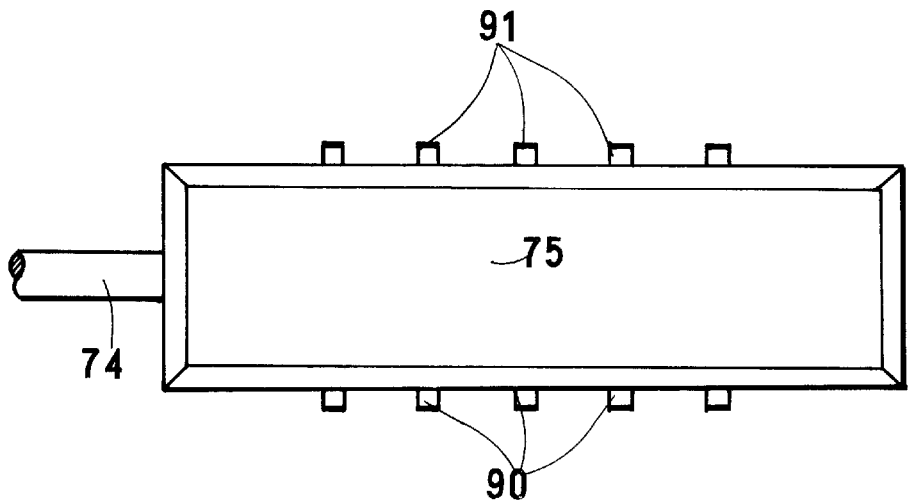
FIG. 17 is a plan view of Embodiment 7 which has been molded in a plastic package.

FIG. 17 shows a plan view of the molded LD/PD module. The module has a ferrule 74 or fiber projecting from the front end and pins 90 and 91 on both sides. The packaged LD module of Embodiments 1 to 6 has a similar shape to FIG. 17 except the number of pins.

Figure 18:
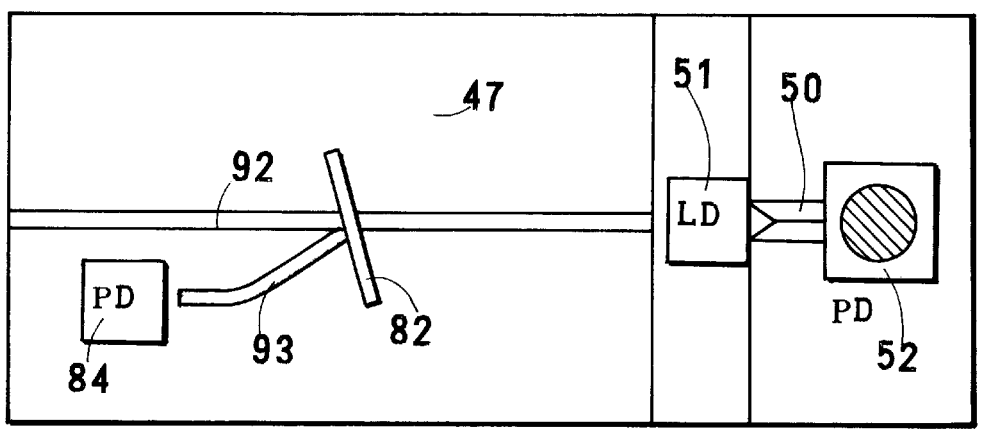
FIG. 18 is a plan view of Embodiment 8 which has a WDM filter allowing the sending light to pass straightly but reflecting the receiving light, an LD laid at the end of the light waveguide and receiving PD arranged at a side of the central light waveguide.

[Embodiment 8 (LD/PD Module with Front End Incidence Type PD; FIG. 18)]

FIG. 18 shows Embodiment 8 which is an LD/PD module making use of a front end incidence type PD. A substrate 47 has a light waveguide layer with a straight, central core 92, an LD 51 fitted on a lower part, a path conversion groove 50 and a monitoring PD 52 along the extension of the core 92. In addition to the central straight waveguide 92, the substrate 47 has an extra waveguide (core) 93 branching at a point from the central waveguide 92. A WDM filter 82 is slantingly provided at the branching point.

A signal receiving front end incidence type PD 84 is stuck at the end of the branched waveguide 93 on the substrate 47.

The transmission light emitted forward from the LD 51 travels in the waveguide 92, passes the WDM 82, propagates in the waveguide 92 and enters an outer fiber. The receiving light emitted from the outer fiber (not shown) is given to the waveguide 92, is reflected by the WDM 82 and is injected into the PD 84 via the front end.

Figure 19:
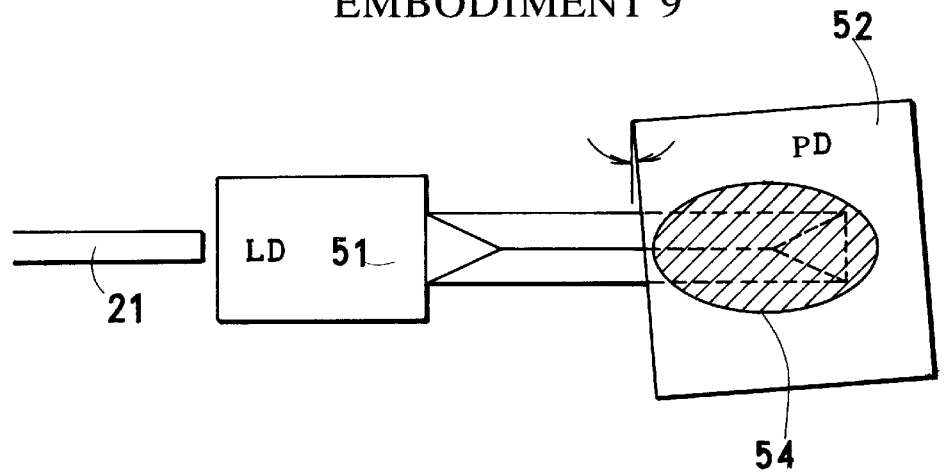
FIG. 19 is a plan view of Embodiment 9 which has a monitoring PD askew at ten to twenty degrees to the axial line.

[Embodiment 9 (Skewing of PD; FIG. 19)]

Figure 20:
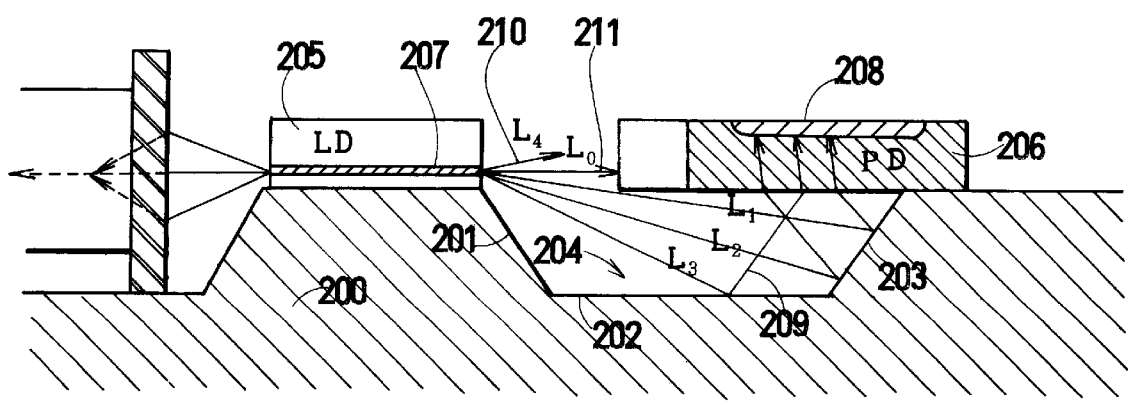
FIG. 20 is a sectional view of an LD module proposed by German Patent DE43 13 492 C1, "Anordnung zur Ankopplung eines optoelektronischen Empfangselementes an ein optoelektronisches Sendeelement", inventors; Schwanderere Bernhard, Kuke Albrecht.

FIG. 19 shows Embodiment 9 which skews the monitoring PD 52 at an angle of 10 degrees to 20 degrees around the normal line. The skew prevents the light reflected at the front end of the PD from returning to the LD 51. In practice, since the PD lies higher than the LD, only upward rays shoot the front end of the PD. The horizontal ray does not collide with the PD. The upward reflected rays cannot return the emission stripe in the LD 51 again without the skew disposition of the PD. The requirement for skewing is weaker than the prior art of FIG. 20.

Figure 21:
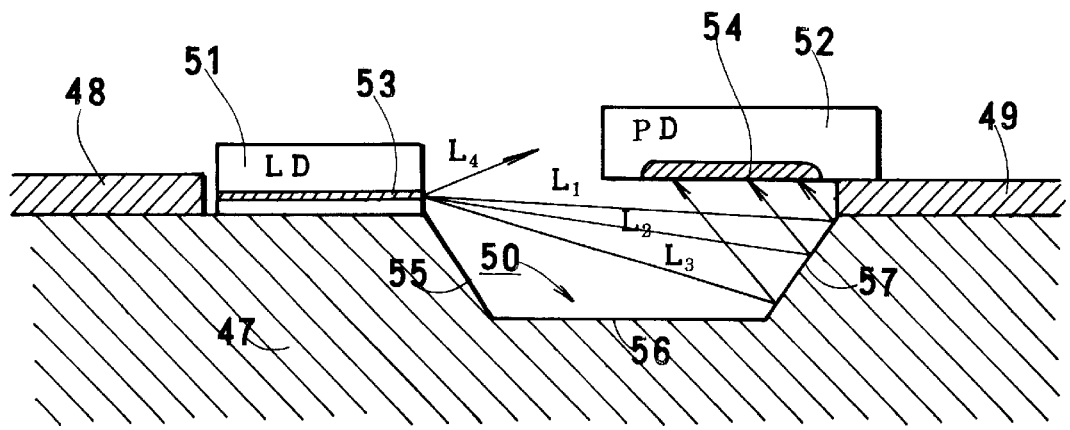
FIG. 21 is a sectional view of Embodiment 10 which has a top surface incidence type PD fixed upside down over the path conversion groove on the waveguide layer.

[Embodiment 10 (Top Surface Incidence Type PD; FIG. 21)]

This invention is applicable to a top surface incidence type PD. FIG. 21 shows Embodiment 10 having a top surface incidence type PD having a p-region on the top, an annular p-electrode on the p-region and a complete bottom n-electrode. The light goes via the top opening enclosed by the annular p-electrode. The substrate 47 has the light waveguide layers 48, 49, the LD 51 and the path conversion groove 50 like Embodiment 1. A top surface incidence type PD 52 is upside down (epi-down) fixed upon the light waveguide layer 49 over the groove 50. The downward rays $L_1, L_2, L_3$ emitted backward from the LD 51 are reflected by the slanting wall 57 of the path conversion groove 50 and are introduced into a top sensing region 54 of the PD 52. Replacement of the bottom incidence PD of Embodiments 2 to 9 produces additional embodiments of the invention which are not described further for avoiding complication.

[Embodiment 11 (Longitudinal Groove of Horizontal Bottom; FIG. 22–FIG. 27)]

Figure 22:
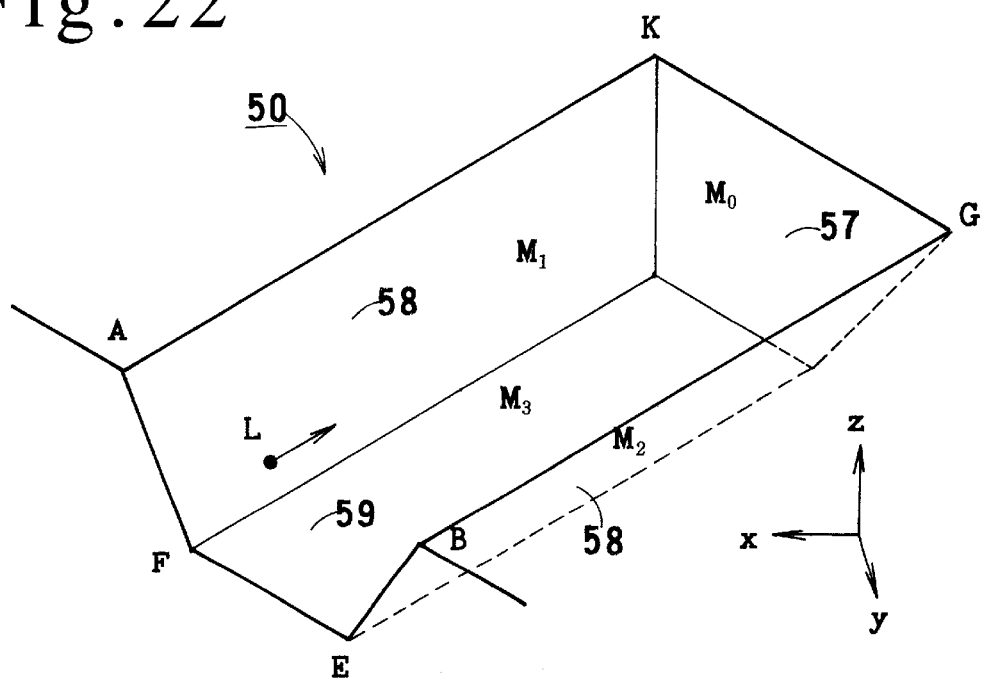
FIG. 22 is a perspective view of a path conversion groove of Embodiment 11 which gives a bottom surface to the middle of the path conversion groove.

The path conversion grooves described hitherto are grooves of sharp-edged, wedge-like section constructed by {111} planes which are made by anisotropic etching of a Si single crystal substrate. Other shapes of grooves are also available. Instead of the wedge-like section, a promising candidate is a groove having a shallow horizontal bottom with four slanting walls as shown in FIG. 22. The horizontal bottom groove has two advantages. One advantage is the curtailment of etching time. It takes long time to etch a groove with a deep edge bottom. But a shallow groove can be etched in short time. Another advantage is an increase of the reflection of the LD rear light. The point is rather difficult to understand. The reason why the reflection is reinforced by the shallow flat bottom groove is demonstrated by referring to FIG. 22 to FIG. 28. In addition to the silicon bench, the shallow flat bottom groove can be applied to a ceramic substrate, a plastic substrate or a glass substrate.

Figure 23:
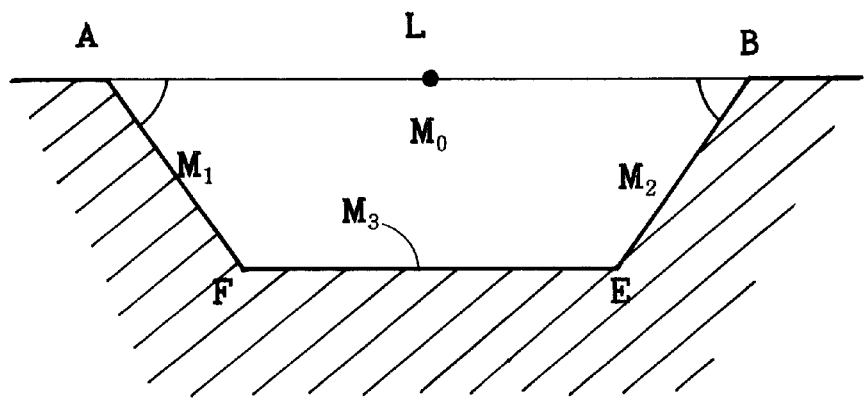
FIG. 23 is a vertically sectioned view of the path conversion groove of Embodiment 11 having the flat, horizontal bottom.

FIG. 22 is a perspective view of the flat-bottom path conversion groove of Embodiment 11. FIG. 23 is a vertically sectioned view of the same flat-bottom path conversion groove. The path conversion groove 50 has four slanting side walls 55, 57, 58 and 58' and a flat bottom 59. The bottom 59 and the rear slanting wall 57 reflect the rear light emitted far downward from the LD 51 and guide the light into the PD 52. The rear light emitted slightly downward from the LD is once reflected by the rear slanting wall 57 and is guided into the PD 52. The rear emission point of the LD is denoted by "L". FIG. 22 and FIG. 23 are sectional views taken in a plane which includes point L and is vertical to the axial line. The corners of the sectioned groove are designated by A, B, E and F. ABEF is a trapezoid. The slanting walls 57, 58 and 58' and the bottom 59 which are preferably plated or evaporated with gold or aluminum act as mirrors. The rear slanting wall 57 is the most significant among the five walls. The rear slanting wall 57 is denoted by "$M_0$". The bottom is denoted by "$M_3$". The bottom mirror $M_3$ is the next important to $M_0$. The side mirrors 58 and 58' are designated by "$M_1$" and "$M_2$". The path conversion groove can be deemed to be an assembly of mirrors $M_0$ to $M_3$.

Figure 25:
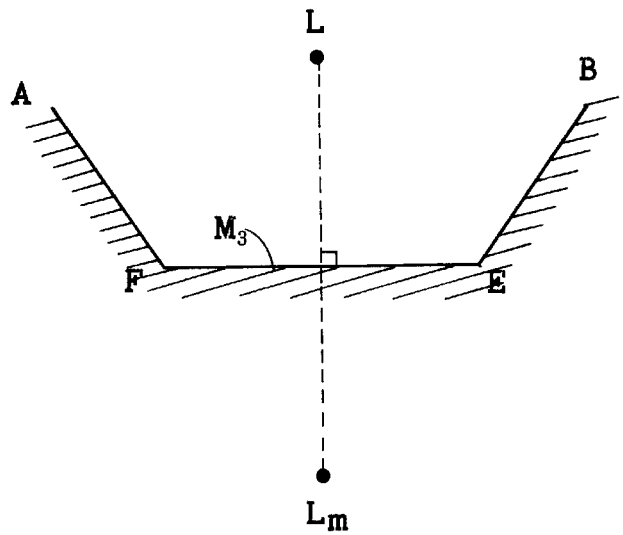
FIG. 25 is a vertically sectioned view of the path conversion groove having the flat bottom for showing an occurrence of the image point ($L_m$) of the emission point (L) of the LD with regard to $M_3$.

"$L_m$" means a mirror image point of emission point L with regard to the bottom mirror $M_3$, as shown in FIG. 25. The light emitted from L and reflected by $M_3$ can be deemed as straight light emitted from the image point $L_m$.

Figure 24:
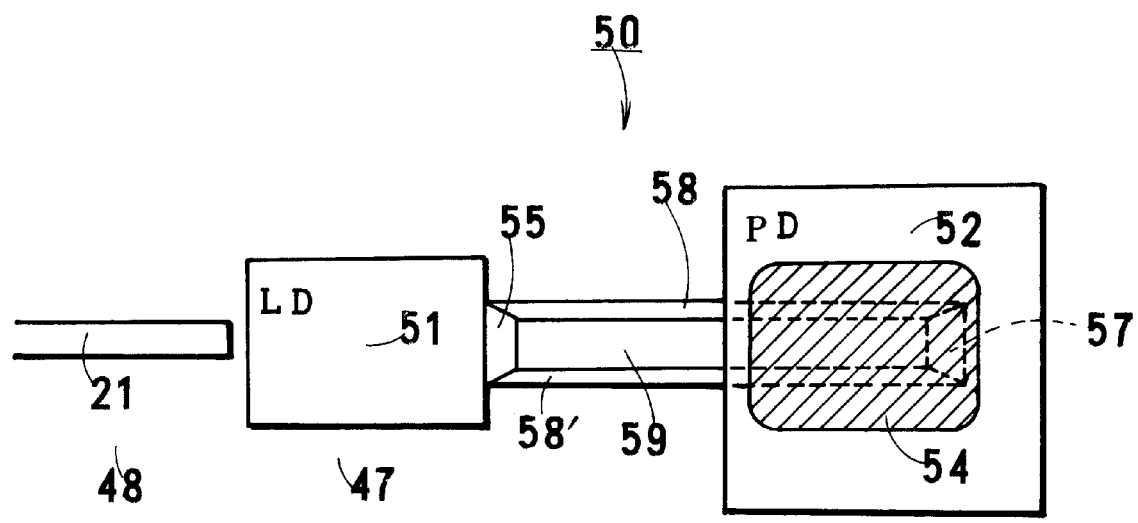
FIG. 24 is a plan view of Embodiment 11 having the path conversion groove with the flat bottom.

FIG. 24 is a plan view of Embodiment 11 with the path conversion groove 50 having the flat bottom 59 between the LD 51 and the PD 52. Embodiment 11 is similar to Embodiment 1 except the shape of the path conversion groove. The flat-bottom path conversion groove is applicable also to Embodiments 2 to 10. The operation of Embodiment 11 will clarify the function of Embodiments 2 to 10 modified to have the flat bottom groove.

How much light power arrives at the PD and makes the monitoring photocurrent depends upon the length, the depth or the inclination angle of the path conversion groove. Embodiment 11 enhances the freedom of design by giving the option of the depth of the groove irrespective of the width of the groove. The shallower the groove is, the more important the role of the flat bottom $M_3$ becomes. The longer the groove is, the more important the role of the bottom $M_3$ becomes. On the contrary, for a deep and short groove, $M_0$ is more significant than $M_3$. The facts can be described qualitatively. For describing the facts quantitatively, the reflection should be calculated by the beam tracing method from the emission angle distribution of the LD.

Figure 26:
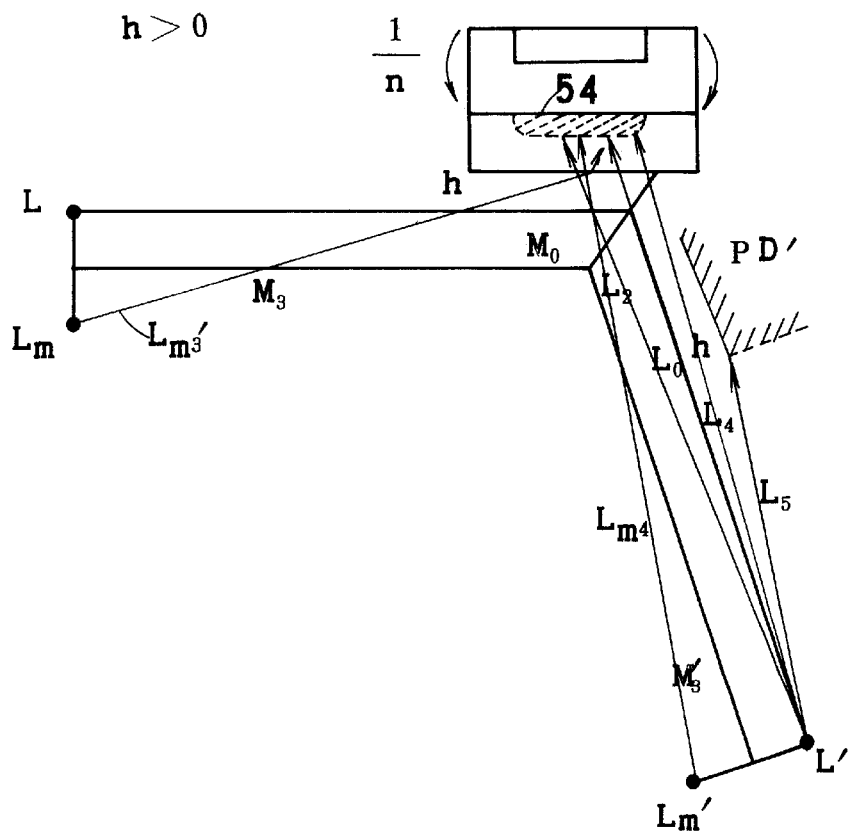
FIG. 26 is an explanatory view of the LD, the PD, the LD beams and the path conversion groove sectioned for replacing a downward beam emitted from the point L (LD) and reflected at $M_0$ by the beam starting from $L_m$ (the image point of L), and replacing the horizontally straight beam emitted from the point L (LD) and reflected at the slanting wall ($M_0$) by the beam starting from point L' which is an image point of L with regard to the slanting wall ($M_0$).

FIG. 25 of the section of the path conversion groove shows an occurrence of the image point $L_m$ at the point symmetric to the emission point L with regard to the bottom mirror $M_3$. Line $LL_m$ is vertically bisected by $M_3$. $M_3$ generates a virtual light source at the image point $L_m$. The rays emitted from L and reflected by $M_3$ are equivalent to virtual straight rays emanating from the image point $L_m$ (FIG. 26). Some portion of the virtual rays starting from $L_m$ goes into the PD but other portion of the virtual rays from $L_m$ is once reflected by the rear slanting wall $M_0$ and is guided to the PD. The division is caused by the difference of the inclination of the rays to the axial (horizontal) line.

The reflection modes are clarified by referring to FIG. 26 which is a longitudinal section of the mirrors in the groove. Point L is the real emission point of the LD. Point $L_m$ is the image point of L regarding to the bottom $M_3$. The middle slanting line below the PD 52 is the rear slanting mirror $M_0$ (57). Image points of L and $L_m$ with regard to $M_0$ are denoted by L' and $L_m$'. Here, the LD rays are deemed to be emitted from the first virtual emission point $L_m$, the second virtual emission point L' and the third virtual emission point $L_m'$. The horizontal line drawn from L means the strongest horizontal ray which is reflected at $M_0$ and is introduced into the PD 52. The PD 52 is higher than the horizontal ray by "h" (thickness of the waveguide layer). The gap h allows the strongest horizontal ray to shoot $M_0$ and enter the PD, which is the main purpose of the present invention. Rays are refracted at the bottom of the PD 52. Here the PD 52 is reduced into a 1/n height. Here, "n" is a ratio of the refractive index of the substrate of the PD divided by the refractive index of the surrounding transparent resin. The height of the light receiving region 54 is lowered to 1/n in the figure. The refracted beams at the bottom can be replaced with straight beams without bending due to the 1/n reduction in height.

Figure 27:
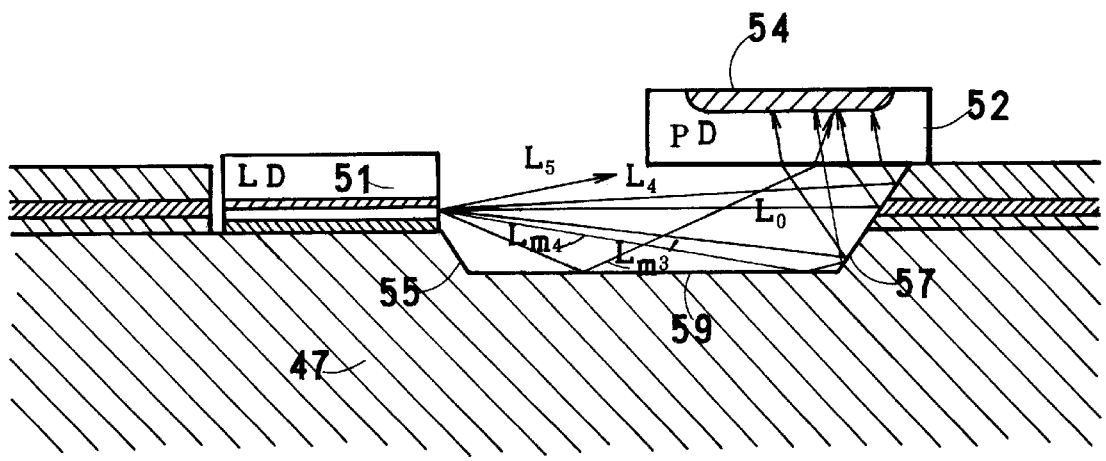
FIG. 27 is a vertically sectioned view of Embodiment 11 having the flat bottom groove for showing paths of the beams emitted from the LD and reflected by the bottom wall and the slanting end wall of the path conversion groove.
Figure 28:
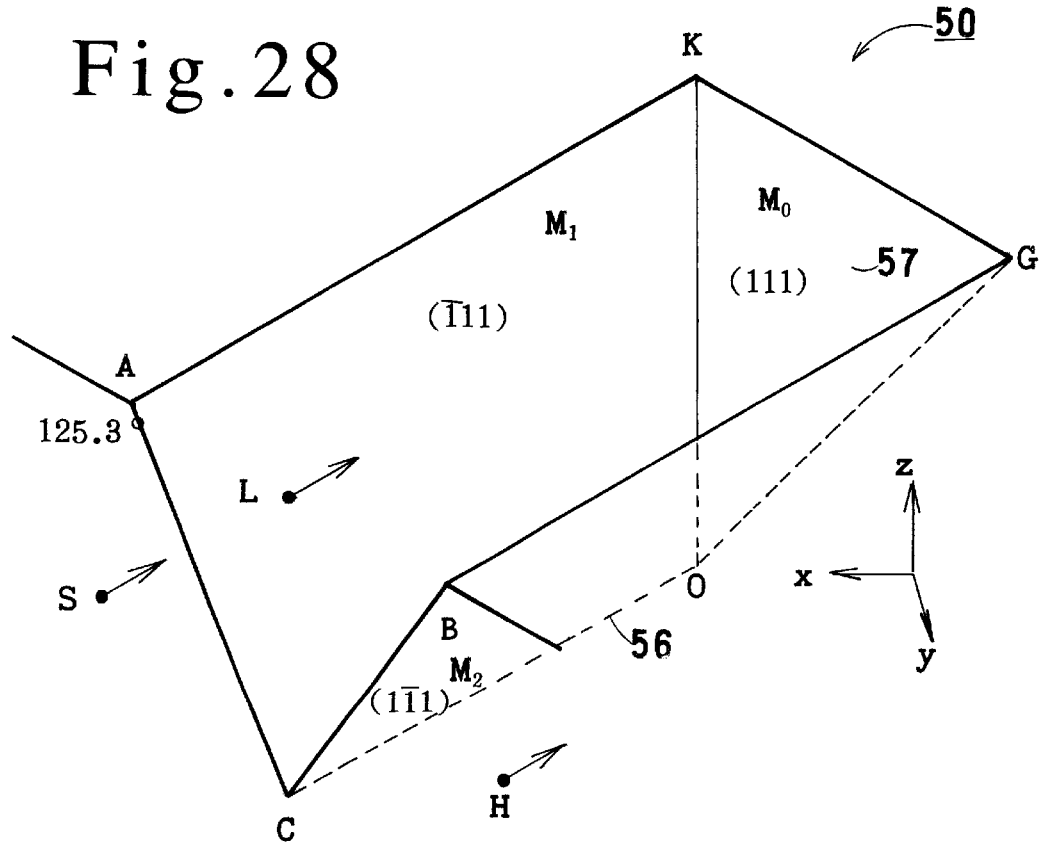
FIG. 28 is a partially-sectioned perspective view of the path conversion groove and the light emission point L.
Figure 29:
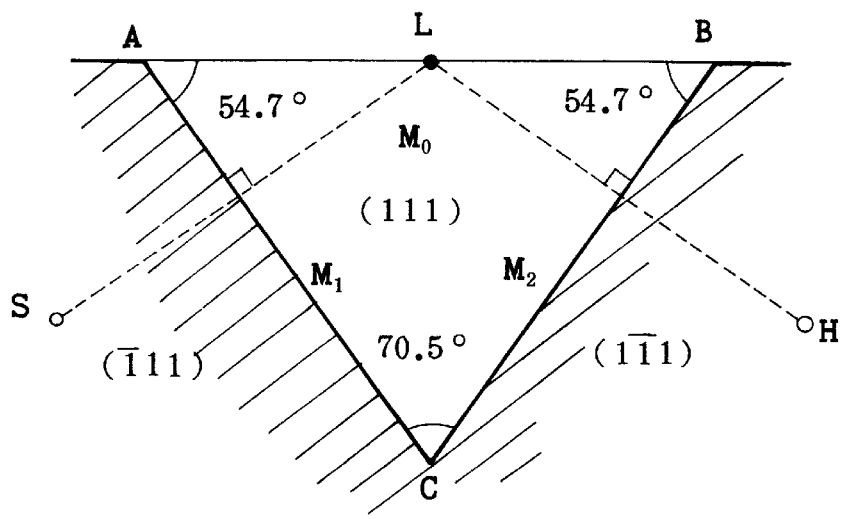
FIG. 29 is a sectional view of the path conversion groove showing the light source point (L) and image points of the light source point (L) with regard to the surfaces of the groove.
Figure 30:
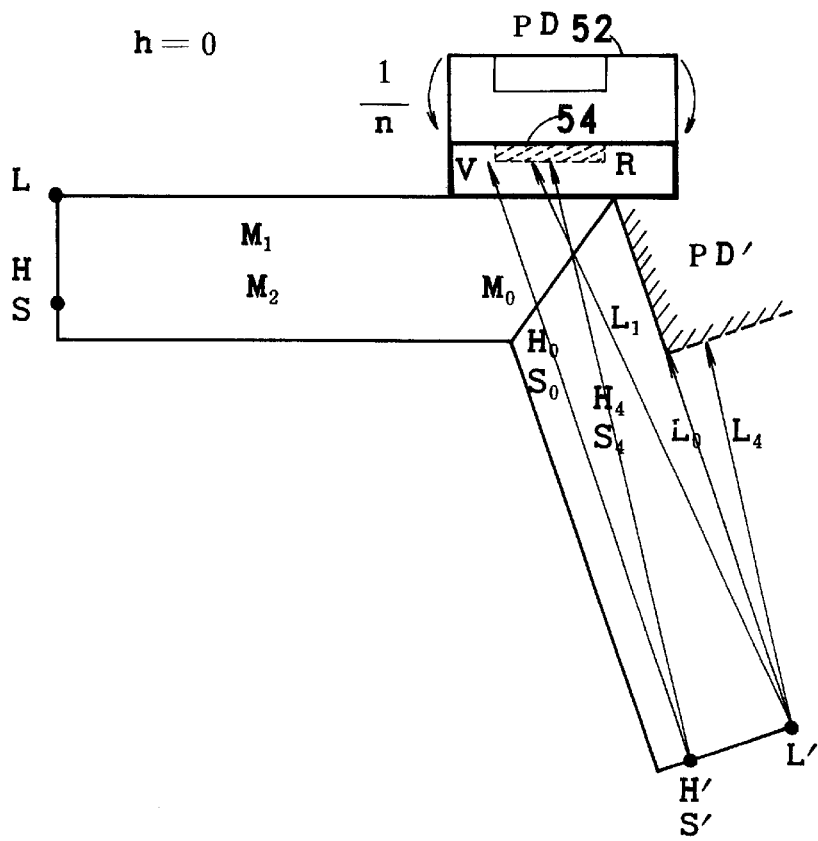
FIG. 30 is an explanatory view of the groove, the PD, the light source point L, image points (H and S) of L with regard to the mirrors $M_1$ and $M_2$, the image points L', H' and S' of L, H and S with regard to the mirror $M_0$ and the beams which are rewritten to direct lines by deeming the beams emitted from virtual points L' and H', S' that are image points of L and H, S when the height h (the height of the PD bottom from the central beam line) is 0 (h=0).
Figure 31:
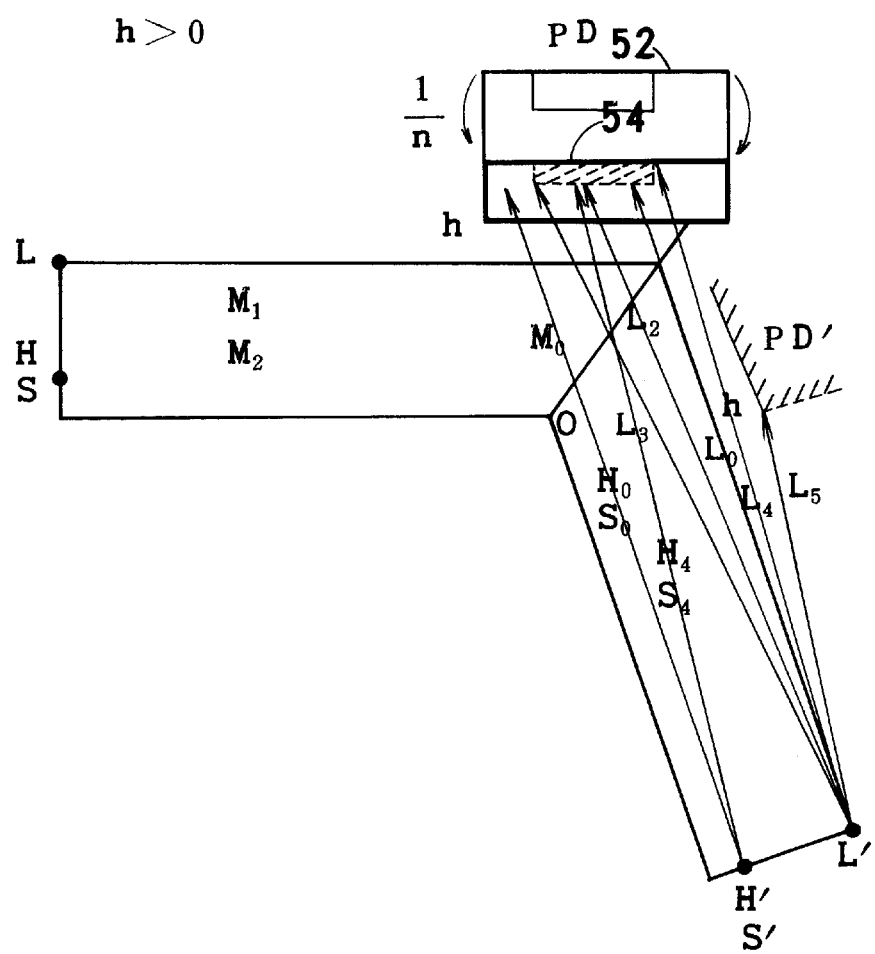
FIG. 31 is an explanatory view of the groove, the PD, the light source point L, image points (H and S) of L with regard to the mirrors $M_1$ and $M_2$, the image points L', H' and S' of L, H and S with regard to the mirror $M_0$ and the beams which are rewritten to direct lines by deeming the beams emitted from virtual points L' and H', S' that are image points of L and H, S when the height h (the height of the PD bottom from the central beam line) is positive (h>0).

FIG. 27 shows the longitudinal section of Embodiment 11. Complex multireflected rays appearing in FIG. 27 are replaced by straightforward rays emitted from $L_m'$, or $L'$ in FIG. 26.

There are three different reflection modes.

(α) Single Reflection at $M_0$

This is the most important reflection mode. The rays reflected once at $M_0$ are replaced by the straight rays emanating from $L'$ (image point of L regarding $M_0$). All the rays starting from $L'$ and crossing $M_0$ belong to α mode. For example, the horizontal ray $L_0$, slightly upward ray $L_4$ and slightly downward ray $L_2$ are attributed to this significant mode. The lift of the PD 52 (namely, h>0) allows the strongest lay $L_0$ and the next strongest ray $L_4$ to enter the PD 52, which enhances the PD monitoring photocurrent. Further, upward ray $L_5$ is shielded by the side of the PD. But since the LD has a narrow emittance, $L_5$ is weak enough. The loss of $L_5$ is trivial.

(β) Double Reflection at $M_3$ and $M_0$

The existence of the bottom endows the LD module with this mode (β). This is the next important reflection mode. The rays reflected once at $M_3$ and reflected again at $M_0$ are replaced by the straight rays emanating from $L_m'$ (image point of $L_m$ regarding $M_0$). $M_3'$ is an image of $M_3$ regarding to $M_0$. All the rays starting from $L_m'$ and crossing $M_3'$ and $M_0$ belong to β mode. For example, the downward ray $L_{m4}$ is attributed to this mode. When the groove is sufficiently shallow, β mode is more influential than α mode.

(γ) Single Reflection at $M_3$

The shallow bottom causes such a probability of the mode γ. Mode γ means the virtual ray $L_{m3}'$ emitted from $L_m$ passing $M_3$ and arriving at the bottom of the PD 52. The same ray $L_{m3}'$ is depicted in FIG. 27. The far downward ray $L_{m3}'$ collides with the bottom and shoots the PD without striking the rear end wall 57. If the monitoring device is an epi-down mounted top incidence type PD, $L_{m3}'$ ray is effective to increase the photocurrent.

We claim:

1. An optical communication device comprising:
    a substrate;
    a light waveguide layer formed on the substrate and having a core for guiding light;
    an LD mounted on a part of the substrate prepared by eliminating a portion of the waveguide layer;
    a path conversion groove having slanting walls and being formed by perforating the substrate behind the LD for reflecting rear light emitted backward from the LD; and
    a monitoring PD supported at a point higher than the LD over the path conversion groove for monitoring the rear light emitted backward from the LD and reflected by the path conversion groove.

2. The optical communication device according to claim 1, wherein the monitoring PD is mounted upon the light waveguide layer, the LD is bonded upon a naked part of the substrate where all of the light waveguide layer has been eliminated, and the PD is higher than the LD by the thickness of the light waveguide layer.

3. The optical communication device according to claim 1, wherein the light waveguide layer consists of an undercladding formed upon the substrate, the core for guiding light and an overcladding covering the core and the undercladding, the monitoring PD is mounted upon the light waveguide layer, the LD is bonded upon the undercladding without the overcladding layer and the core and the PD is higher than the LD by the thickness of the overcladding.

4. The optical communication device according to claim 1, wherein the substrate is a semiconductor substrate selected from a group of a silicon substrate, a GaAs substrate and an InP substrate.

5. The optical communication device according to claim 1, wherein the substrate is a ceramic substrate, a glass substrate or a plastic substrate having a slantingly polished rear light waveguide layer following the rear end of the path conversion groove for enhancing reflection of horizontally emitted rear LD light.

6. The optical communication device according to claim 1, wherein the path conversion groove has slanting side walls, a front slanting wall and a rear slanting wall which are coated with a metal film or a dielectric film for raising a reflection rate.

7. The optical communication device according to claim 1, wherein the path conversion groove has slanting side walls, a front slanting wall, a rear slanting wall and a flat bottom which are coated with a metal film or a dielectric film for raising the reflection rate.

8. The optical communication device according to claim 6, wherein the metal film is an Au film or an Al film.

9. The optical communication device according to claim 7, wherein the metal film is an Au film or an Al film.

10. The optical communication device according to claim 1, wherein the end of the lightwaveguide, the LD, the PD and the path conversion groove are covered with a transparent resin.

11. The optical communication device according to claim 1, wherein the light waveguide is a $SiO_2$-made light waveguide.

12. The optical communication device according to claim 1, wherein the PD is a bottom incidence type PD and the PD is bonded with a light receiving region facing upward on the light waveguide layer.

13. The optical communication device according to claim 1, wherein the PD is a top incidence type PD and the PD is bonded with the light receiving region facing downward on the light waveguide layer.

14. The optical communication device according to claim 1, wherein the LD is epi-down mounted on the substrate.

15. The optical communication device according to claim 1, further comprising a signal receiving PD bonded on the substrate and a WDM filter provided at a middle part of the light waveguide layer, wherein receiving light is divided by the WDM filter and guided into the signal receiving PD.

16. The optical communication device according to claim 1, wherein a larger V-groove and a smaller V-groove are formed at an end of the substrate, a ferrule is attached to a front end of an optical fiber, the ferrule is fixed in the larger V-groove and the fiber is fixed in the smaller V-groove.

* * * * *